US011798646B2

(12) United States Patent
Alam et al.

(10) Patent No.: US 11,798,646 B2
(45) Date of Patent: Oct. 24, 2023

(54) SYSTEMS AND METHODS FOR MONITORING AND MANAGING MEMORY DEVICES

(71) Applicant: Everspin Technologies, Inc., Chandler, AZ (US)

(72) Inventors: Syed M. Alam, Austin, TX (US); Jason Janesky, Gilbert, AZ (US); Han Kyu Lee, Chandler, AZ (US); Hamid Almasi, Chandler, AZ (US); Pedro Sanchez, Chandler, AZ (US); Cristian P. Masgras, Round Rock, TX (US); Iftekhar Rahman, Chandler, AZ (US); Sumio Ikegawa, Phoenix, AZ (US); Sanjeev Aggarwal, Scottsdale, AZ (US); Dimitri Houssameddine, Sunnyvale, CA (US); Frederick Charles Neumeyer, Austin, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 66 days.

(21) Appl. No.: 17/512,392

(22) Filed: Oct. 27, 2021

(65) Prior Publication Data

US 2022/0139488 A1    May 5, 2022

Related U.S. Application Data

(60) Provisional application No. 63/107,173, filed on Oct. 29, 2020.

(51) Int. Cl.
*G11C 29/42* (2006.01)
*G11C 29/12* (2006.01)
(Continued)

(52) U.S. Cl.
CPC .......... *G11C 29/42* (2013.01); *G11C 29/1201* (2013.01); *G11C 29/18* (2013.01);
(Continued)

(58) Field of Classification Search
CPC ..... G11C 29/42; G11C 29/1201; G11C 29/18; G11C 29/4401; G11C 2029/0407; G11C 2029/1202
See application file for complete search history.

(56) References Cited

U.S. PATENT DOCUMENTS 9,934,874 B2 * 4/2018 Tsuji ...................... G11C 29/44
10,303,536 B2 * 5/2019 Tai ...................... G11C 16/3431
(Continued)

FOREIGN PATENT DOCUMENTS

EP    2814035 A1    12/2014

OTHER PUBLICATIONS

International Search Report and Written Opinion in Application No. PCT/US2021/057008, dated Apr. 25, 2022 (23 pages).
(Continued)

*Primary Examiner* — Tuan T Nguyen
(74) *Attorney, Agent, or Firm* — Bookoff McAndrews, PLLC

(57) ABSTRACT

The present disclosure is drawn to, among other things, a method of managing a memory device. In some aspects, the method includes determining whether a first address for a page in a first memory region is mapped in a map table, setting a target address as a second address identified in the map table as being mapped to the first address, setting the target address as the first address, determining a number of bits that fail in each word of a plurality of first-layer error correction code (ECC) words for the target address, and adding the target address to the map table, writing-back contents from the target address to a repair address in the
(Continued)

first memory region, and updating the map table by mapping the target address to the repair address.

20 Claims, 18 Drawing Sheets

(51) Int. Cl.
    *G11C 29/18*     (2006.01)
    *G11C 29/44*     (2006.01)
    *G11C 29/04*     (2006.01)

(52) U.S. Cl.
    CPC .. *G11C 29/4401* (2013.01); *G11C 2029/0407* (2013.01); *G11C 2029/1202* (2013.01)

(56) References Cited

U.S. PATENT DOCUMENTS

| | | | |
|---|---|---|---|
| 10,671,298 B2* | 6/2020 | Rayaprolu | G06F 3/0634 |
| 2009/0313444 A1 | 12/2009 | Nakamura | |
| 2012/0117445 A1 | 5/2012 | Lu et al. | |
| 2020/0174687 A1* | 6/2020 | Lee | G06F 3/061 |
| 2021/0056023 A1* | 2/2021 | Jin | G06F 11/1446 |
| 2022/0229772 A1* | 7/2022 | Jin | G06F 12/0246 |

OTHER PUBLICATIONS

Partial Search Report in International Application No. PCT/US2021/057008, dated Mar. 1, 2022 (19 pages).

* cited by examiner

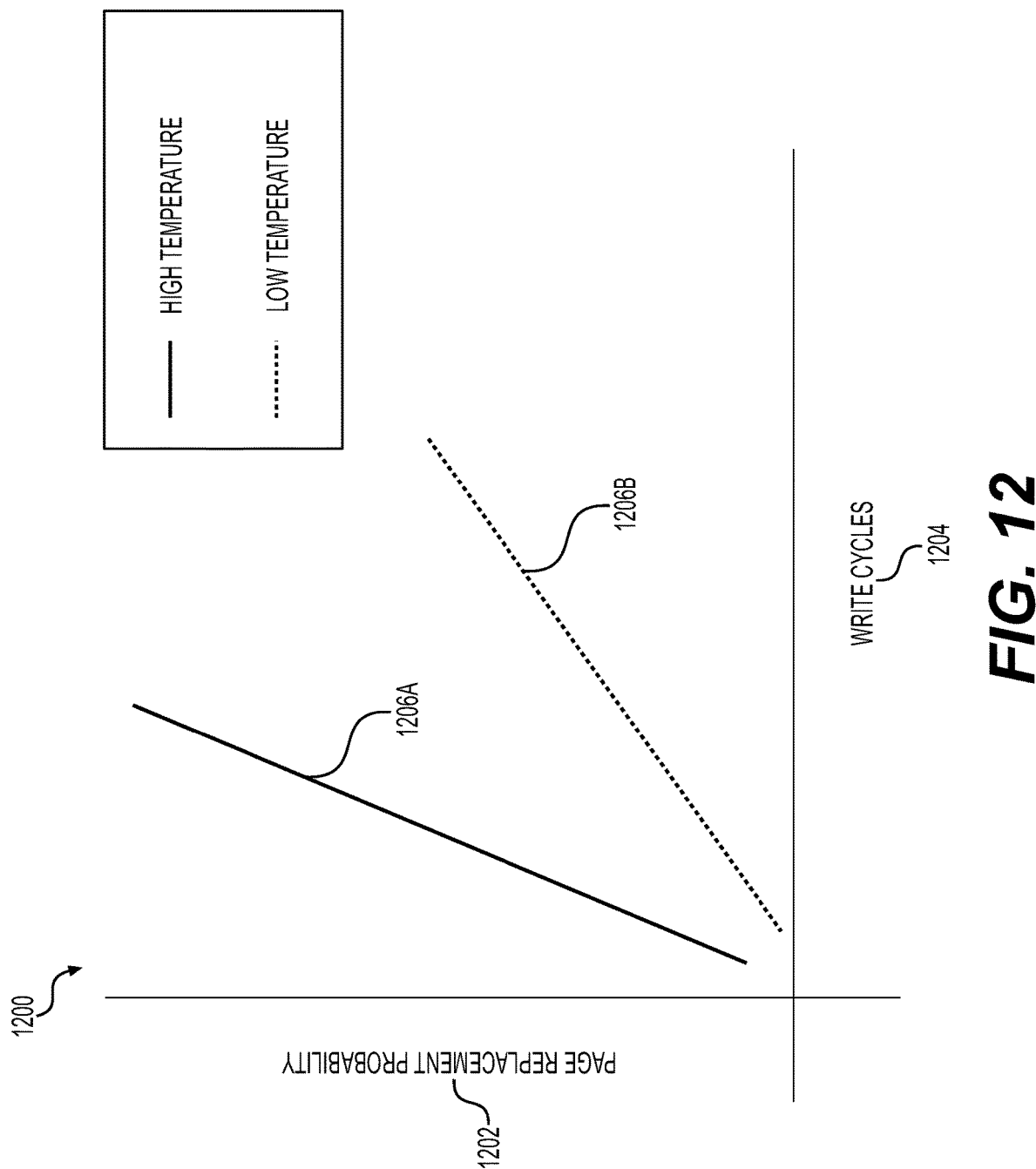

SYSTEMS AND METHODS FOR MONITORING AND MANAGING MEMORY DEVICES

CROSS-REFERENCE TO RELATED APPLICATION

This application claims benefit to U.S. Provisional Patent Application No. 63/107,173, filed Oct. 29, 2020, the entire contents of which are incorporated herein by reference.

TECHNICAL FIELD

Embodiments of the present disclosure relate to, among other things, managing the health and/or extending or otherwise prolonging the lifespan of memory devices. More specifically, in one aspect, embodiments of the present disclosure relate to using a built-in self-repair (BISR) feature for managing the health of memory devices.

INTRODUCTION

In general, a memory system may include a memory device for storing data and a host (or controller) for controlling operations of the memory device. Memory devices may be classified into, e.g., volatile memory (such as, e.g., DRAM or SRAM) and non-volatile memory (such as EEPROM, FRAM (Ferroelectric RAM), PRAM (Phase-change memory), MRAM (magnetoresistive memory), RRAM/ReRAM (resistive memory) and Flash memory).

A magnetoresistive stack used in a memory device (e.g., MRAM) of the present disclosure includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the free magnetic region. The direction of the magnetization vectors of the free magnetic region may be switched and/or programmed (for example, through spin orbit torque (SOT) and/or spin transfer torque (STT)) by application of a write signal (e.g., one or more current pulses) adjacent to, or through, the magnetoresistive memory stack.

By using a BISR feature in an STT-M RAM chip, a useable lifetime of a memory part may be extended by internally mapping a worn-out address to a new location for subsequent accesses. A counter, which may count the number of write or read access to each page, may be used to determine which page of a memory may have the worn-out address. However, using a counter may add complexity to a memory device and may add time to the memory access time. Additionally, counter values may need to be saved in non-volatile memory during a lifetime of the memory device, requiring significant space for the memory device.

The present disclosure relates to memory devices (e.g., devices including magnetoresistive stacks) and methods for using a built-in self-repair (BISR) feature to manage the health of memory devices without using a counter, and to provide improved endurance of a memory device by using a magnetic tunnel junction (MTJ) mini-array to store a map table for mapping worn-out addresses. The scope of the current disclosure, however, is defined by the attached claims, and not by any characteristics of the resulting devices or methods.

BRIEF DESCRIPTION OF THE DRAWINGS

In the course of the detailed description that follows, reference will be made to the appended drawings. The drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

Moreover, there are many embodiments of the present disclosure described and illustrated herein. The present disclosure is neither limited to any single aspect nor embodiment thereof, nor to any combinations and/or permutations of such aspects and/or embodiments. Moreover, each of the aspects of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein; however, all permutations and combinations are considered to fall within the scope of the present inventions.

FIG. 12 depicts an exemplary graph illustrating temperature effects on error detection, according to an aspect of the present disclosure.

Figure 1:
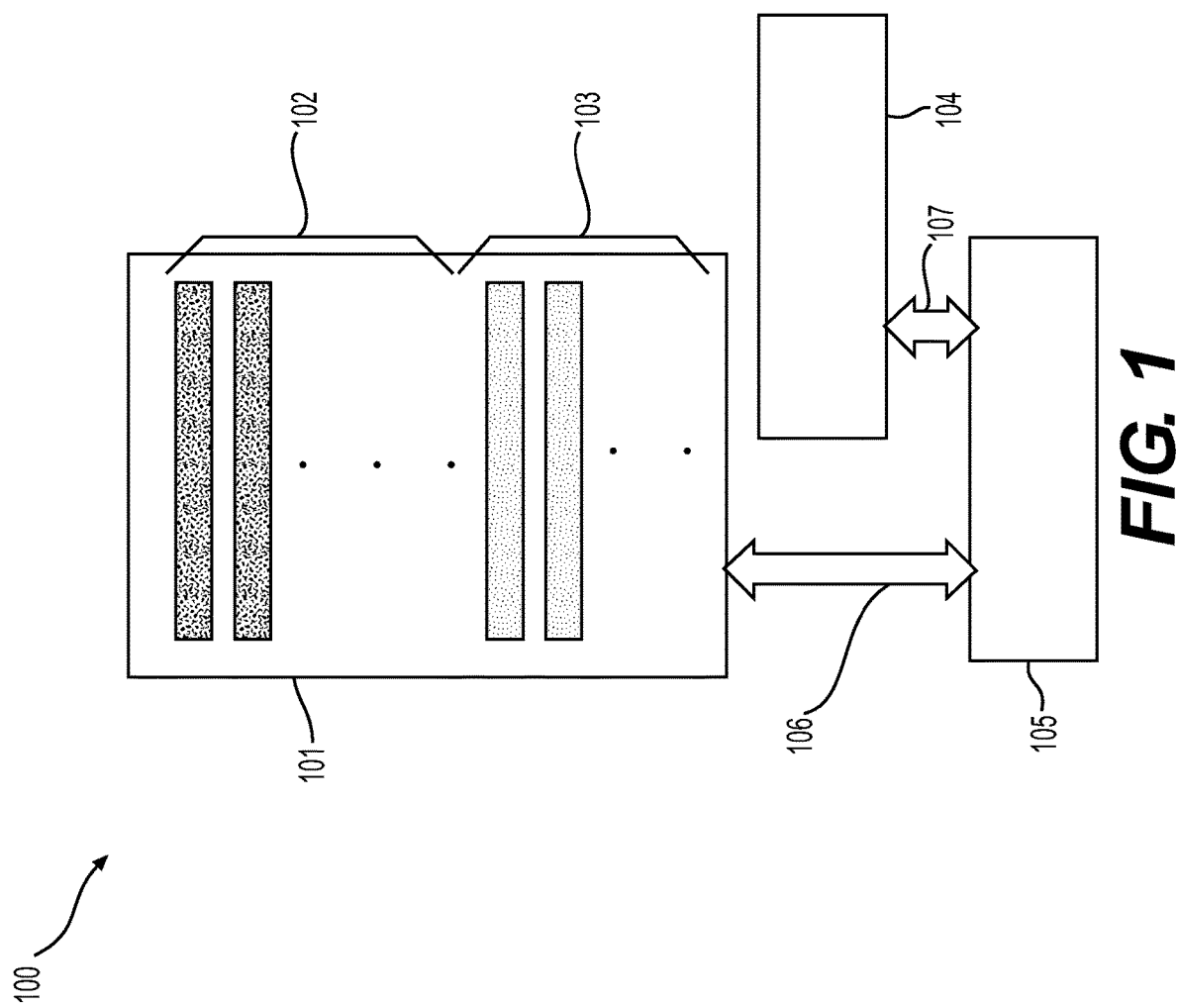
FIG. 1 depicts a block diagram of a bank of memory 100 for a memory device, according to an aspect of the present disclosure.

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

As used herein, the terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. The term "exemplary" is used in the sense of "example," rather than "ideal."

DETAILED DESCRIPTION

Detailed illustrative aspects are disclosed herein. However, specific structural and functional details disclosed herein are merely representative for purposes of describing example embodiments of the present disclosure. The present disclosure may be embodied in many alternate forms and should not be construed as limited to only the embodiments set forth herein. Further, the terminology used herein is for the purpose of describing particular embodiments only and is not intended to be limiting of exemplary embodiments described herein.

When the specification makes reference to "one embodiment" or to "an embodiment," it is intended to mean that a particular feature, structure, characteristic, or function described in connection with the embodiment being discussed is included in at least one contemplated embodiment of the present disclosure. Thus, the appearance of the phrases "in one embodiment" or "in an embodiment," in different places in the specification does not constitute a plurality of references to a single embodiment of the present disclosure.

As used herein, the singular forms "a," "an," and "the" are intended to include the plural forms as well, unless the context clearly indicates otherwise. It also should be noted that in some alternative implementations, the features and/or steps described may occur out of the order depicted in the figures or discussed herein. For example, two steps or figures shown in succession may instead be executed substantially concurrently or may sometimes be executed in the reverse order, depending upon the functionality/acts involved. In some aspects, one or more described features or steps may be omitted altogether, or may be performed with an intermediate step therebetween, without departing from the scope of the embodiments described herein, depending upon the functionality/acts involved.

In one aspect, the present disclosure is directed to techniques and implementations to dynamically monitor and manage the health of memory devices, including, e.g., non-volatile or "permanent" memory capable of maintaining data when a power supply is deactivated (e.g., magnetic memories or magnetic random access memories or MRAMs). Though the description below makes reference to magnetoresistive memory devices (e.g., MRAM), the inventions may be implemented in other memory devices including, but not limited to, EEPROM, FRAM, PRAM, RRAM/ReRAM and/or Flash memory.

With reference now to FIG. 1, there is depicted an example block diagram of a bank of memory 100 for a memory device. A memory device may have one or more memory banks. A bank of memory 100 may include a first memory area 101 having regular pages 102 and repair pages 103. Each of the regular pages 102 and the repair pages 103 may have a same number of bits as each other. As an example, a bank of memory area 101 may have 96 repair pages available for replacement throughout a lifetime of the part. The first memory area 101 may be connected to a data path with ECC 105 through a communication link 106. The data path in each bank of memory may have two layers of orthogonal ECC that operates on a page during read and/or write operations. Additionally, a map table 104 may be connected to the data path with ECC 105 through a communication link 107. The map table 104 may be local to the bank of memory area 101, and the map table 104 may be used to map an address from a regular page that gets worn out to an address on the repair page.

The BISR feature may be triggered during a read operation and/or a write operation. During a read operation, the BISR may be triggered by an uncorrectable ECC fail in a first layer. For example, an uncorrectable ECC fail may occur when three bits in a single word fail. When the BISR is triggered by an uncorrectable ECC fail, the uncorrectable fail may be corrected by the second layer of the ECC, using devices and methods described below.

During a write operation, a write command may occur to a whole page or a partial page. Although the write operation may only be applied to a portion of a page, an ECC calculation applies to the entire page. Thus, a read-modify-write command may be used to ensure that an entire page is accessed, and the BISR may be triggered during the read phase of the read-modify-write.

Figure 2:
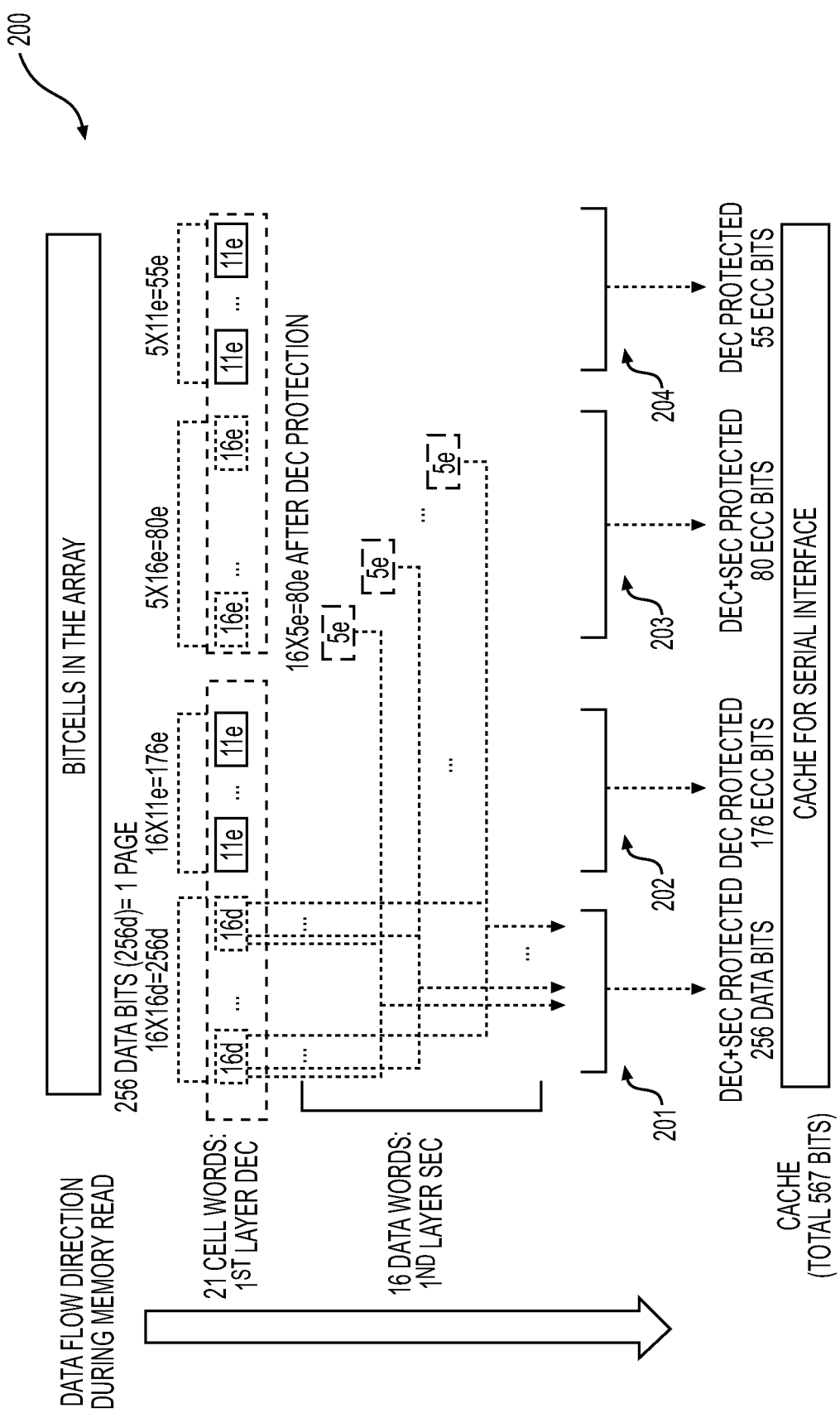
FIG. 2 depicts an exemplary diagram illustrating a BISR trigger using orthogonal error correction code (ECC), according to an aspect of the present disclosure.

FIG. 2 depicts an exemplary diagram 200 illustrating a BISR trigger using orthogonal ECC, according to an exemplary embodiment of the disclosure. One or more components disclosed herein may be part of BISR control logic circuitry and may be used to implement BISR functions. As illustrated at the top of FIG. 2, the bitcells in a memory array may be read (e.g., 256 bits=1 page). According to an exemplary embodiment, 256 data bits may include 16 words of data with 16 bits in each word. However, exemplary embodiments are not limited to 256 bits. As illustrated in section 201, the 256 data bits may include double error correction (DEC) and single error correction (SEC).

The ECC bits are illustrated in sections 202, 203, and 204 of FIG. 2. The ECC bits may be internal to the memory device and the user may never be aware of the ECC bits. The first-layer ECC bits are illustrated in sections 202 (e.g., 176 ECC bits with DEC protection) and 204 (e.g., 55 ECC bits with DEC protection), and the second-layer ECC bits are illustrated in section 203 (e.g., 80 ECC bits with DEC and SEC protection). According to an exemplary embodiment, the first-layer ECC may have a word size of 11 bits. However, exemplary embodiments are not limited to this word size. The first-layer ECC may be protected by DEC and may include threshold error detection (TED) such as a dual error detection, triple error detection, or any other value greater than one, e.g., DEC-TED. The first-layer ECC may not require SEC because a user may never be aware of the fail and may never be aware of the BISR trigger.

If the first-layer ECC includes TED corresponding to a triple error detection, then the BISR may be triggered by a 3-bit fail in any one of a plurality of words (e.g., 21 cell words). When the BISR is triggered by a 3-bit fail, the fail may be corrected in the second layer. The second-layer ECC bits are illustrated in section 203. The second-layer ECC may include single error correction SEC and DEC. The second layer may take a single bit from each word of the first layer to make a correction. If any one word fails, then the second layer may correct the word. The second-layer ECC bits may require two layer protection in order to reduce a bit error rate.

Figure 3:
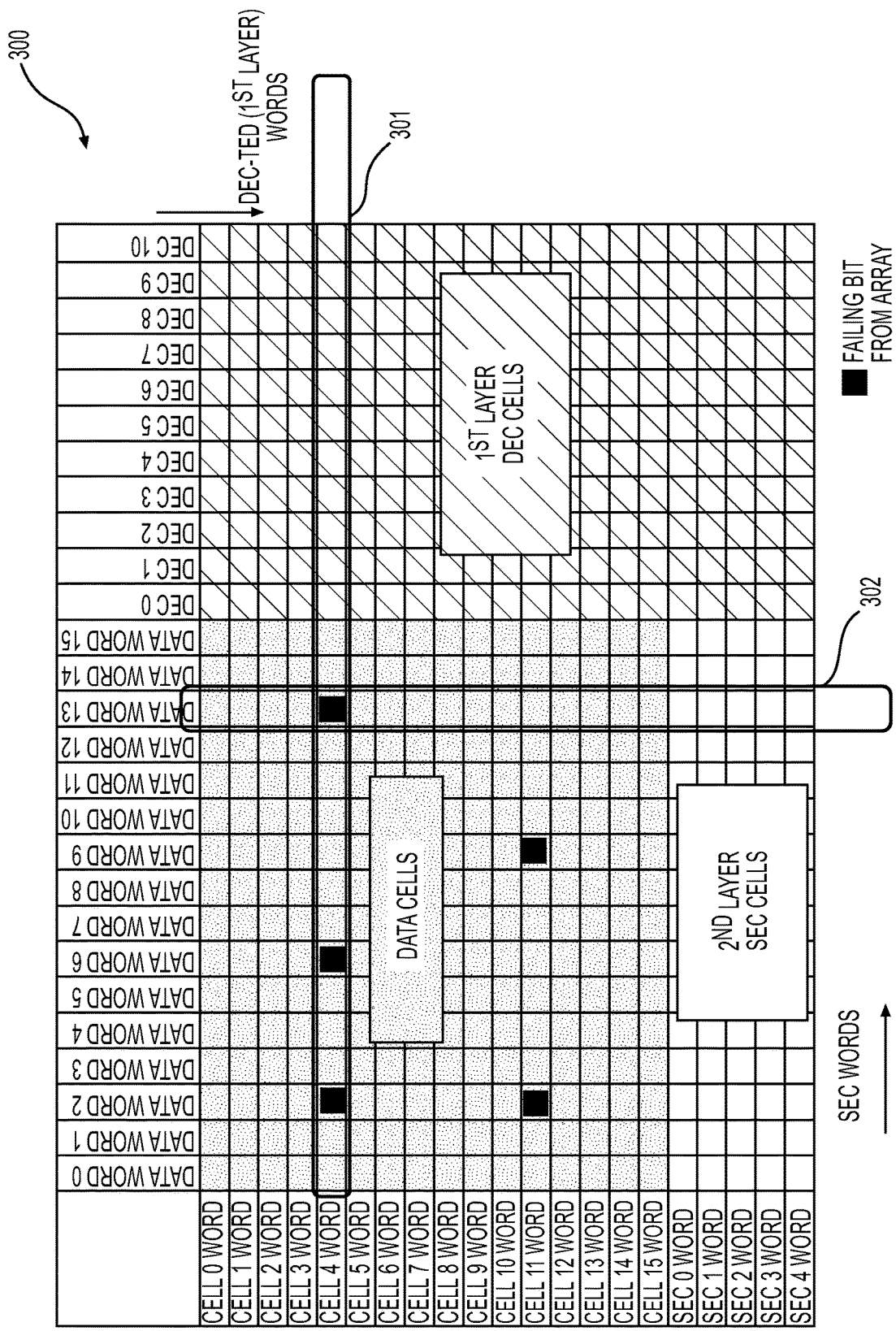
FIG. 3 depicts an exemplary table view for a BISR trigger, according to an aspect of the present disclosure.

FIG. 3 depicts an exemplary table view 300 for a BISR trigger, according to an exemplary embodiment. As described above with respect to FIG. 2, if the first-layer ECC includes TED, e.g., DEC-TED, then the BISR may be triggered by a 3-bit fail in any one of twenty-one cell words (e.g., row 301 and column 302). When the BISR is triggered by a 3-bit fail, the fail may be corrected in the second layer. The fail may be corrected by using repair pages 103. For example, the second-layer ECC may add the failed address to a map table such that when a user requests to access the failed address (e.g., access a first set of MTJs), the request will be redirected such that a different set of MTJs located in repair pages 103 will be accessed instead. An exemplary method of adding the failed address to a map table is described below.

A 2-layer ECC may be organized as DEC in a first stage and DEC in the second stage. According to implementations disclosed herein, BISR may be triggered at TED from the first stage.

Figure 4:
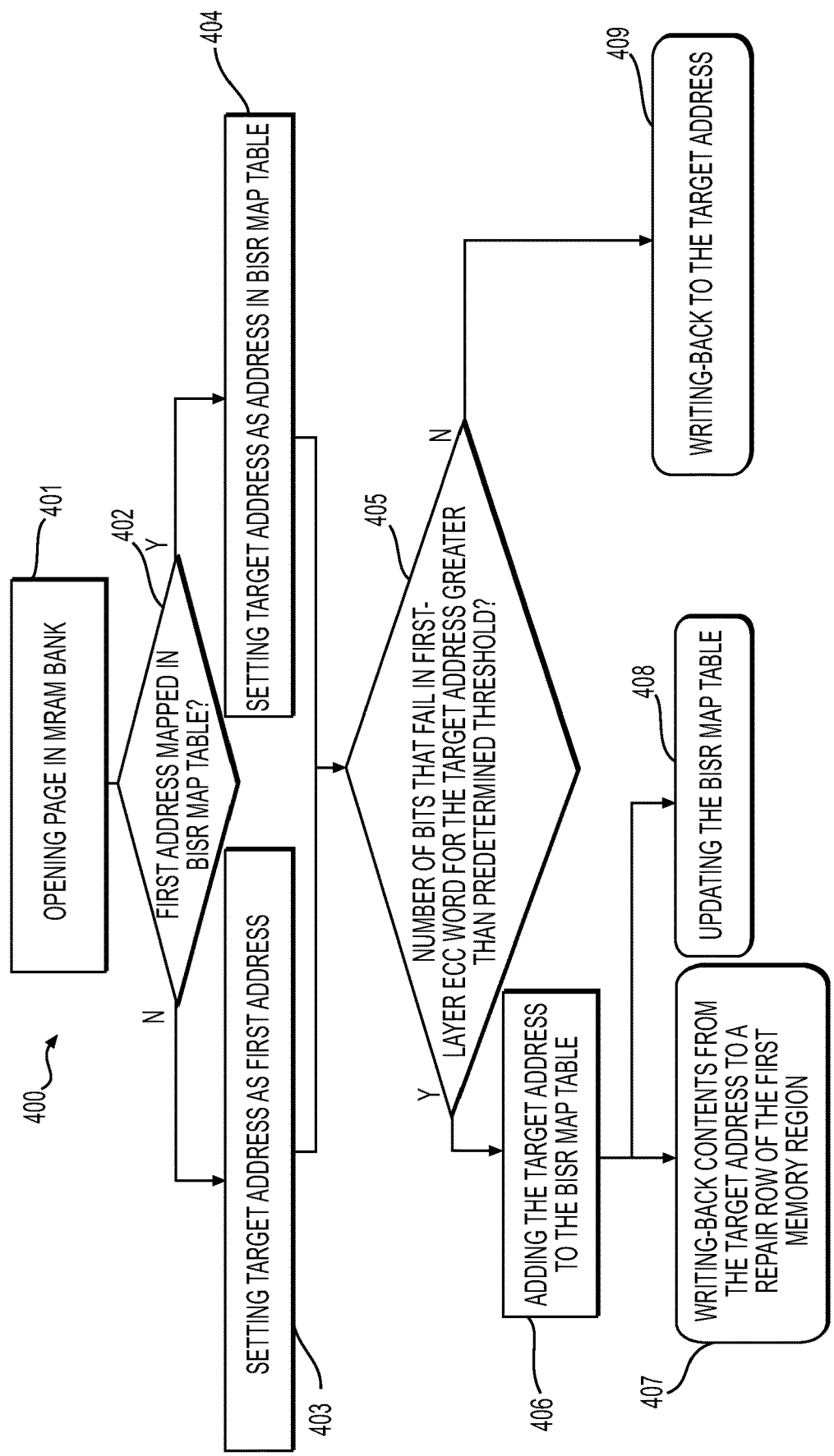
FIG. 4 depicts a flowchart for an exemplary method for performing BISR for a memory device, according to an aspect of the present disclosure.

FIG. 4 depicts a flowchart for an exemplary method 400 for performing BISR for a memory device. In step 401, the method may include opening a page in a MRAM memory bank. In step 402, the method may include determining whether a first address for a page in a first memory region is mapped in a BISR map table. The first memory region may be an area of the memory that includes regular pages 102 of memory and repair pages 103 of memory.

If the first address is not mapped in the BISR map table, indicating that the first address has not previously been identified as needing repair (e.g., 402 (N)), then a target address may be set as the first address in the BISR map table (e.g., step 403). If the first address is mapped in the BISR table, indicating that the first address has previously been identified as failing (e.g., 402 (Y)), then a target address may be set as the address in the BISR map table (e.g., step 404). In step 405, the method may include determining a number of bits that fail in each word of a plurality of first-layer ECC words for the target address. If it is determined that a number of bits that fails is greater than a predetermined threshold (e.g., step 405 (Y)), then the target address may be added to the BISR map table (e.g., step 406). For example, according to an exemplary embodiment, if it is determined that three bits fail in any word, the BISR may be triggered, and the target address may be added to the BISR map table.

In step 407, the method may include writing-back the contents from the target address to a repair address of the first memory region. In step 408, the BISR map table may be updated with the mapping of the target address to a repair address. Steps 407 and 408 may be performed in parallel, to reduce latency. For example, the method may include writing-back the contents from the target address to a repair address while simultaneously updating the BISR map table mapping the target address to the repair address. If it is determined that the number of bits that fail are less than or equal to the predetermined threshold (e.g., step 405 (N)), then the method may include writing-back the contents to the target address (e.g., step 409).

According to an exemplary embodiment, the map table may be stored in non-volatile memory, and the map table may be updated during a power-up of the memory device. Additionally, the determining the number of bits that fail may be performed during a read operation and/or a write operation.

According to an exemplary embodiment, the ECC may be provided as a single layer multiple bit correction ECC. If the ECC is n-bit correction, then the BISR feature may be triggered when n−1 bits fail. For example, the ECC may be provided as a single layer 4-bit correction ECC, and the BISR may be triggered when 3 bits fail.

According to an exemplary embodiment, in a situation in which limiting access time and/or limiting area are not a significant consideration, the BISR map table may be stored in a fuse bank.

Figure 5A:
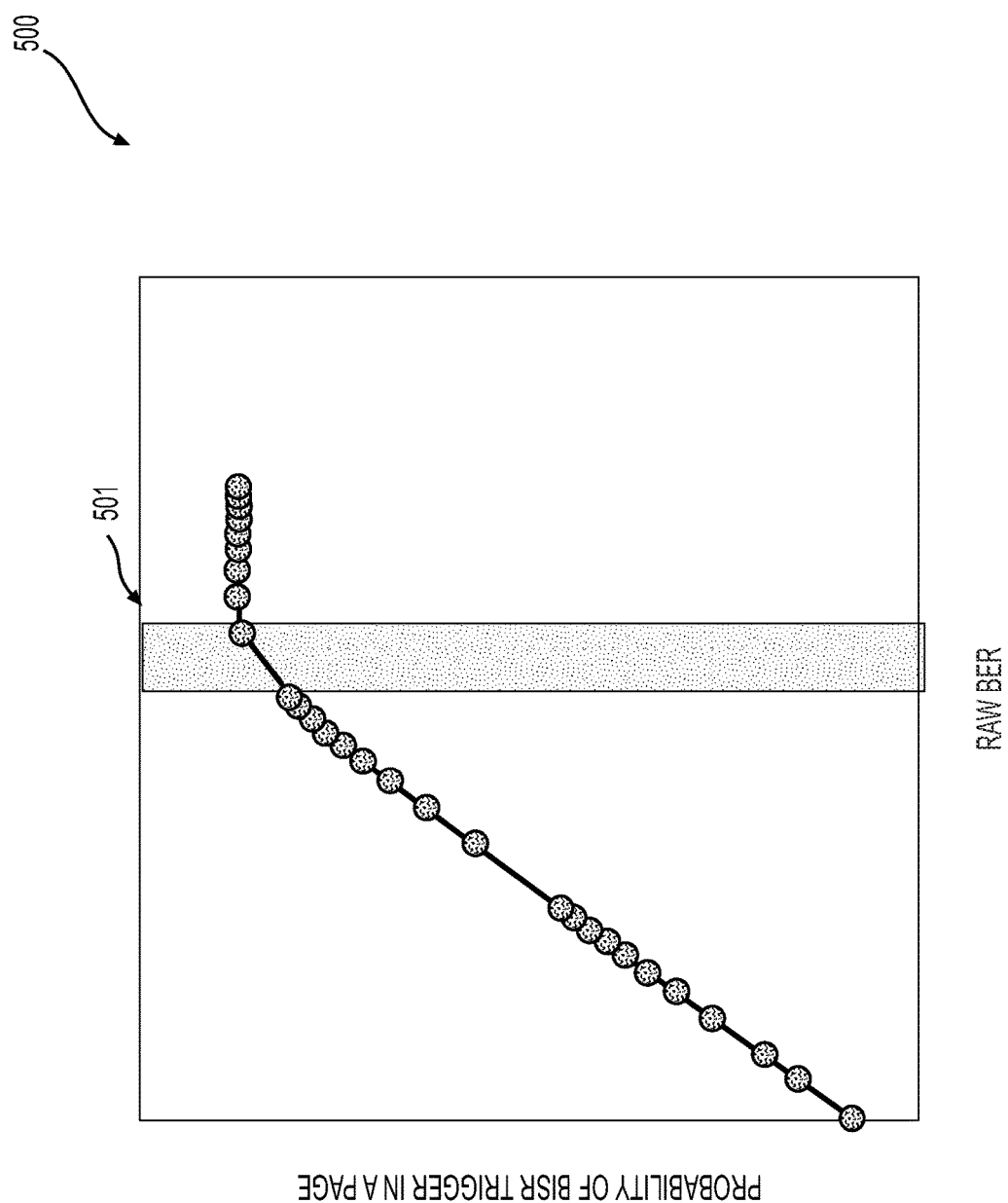
FIG. 5A depicts an exemplary graph illustrating a probability of a BISR trigger in a page based on an MTJ raw bit error rate (RBER), according to an aspect of the present disclosure.

FIG. 5A depicts an exemplary graph 500 illustrating a probability of a BISR trigger in a page based on an MTJ raw bit error rate (RBER). For example, a BISR trigger threshold may refer to the MTJ RBER at which the BISR is triggered. As described above, in the first-layer ECC, there may be 21 words, and the BISR may be triggered if any one row of the 21 words includes 3 bit fails. As illustrated in section 501 of FIG. 5A, the probability of the BISR trigger in a page approaches 1 as the corresponding RBER approaches and passes a given RBER. For example, the triggering of BISR may occur more often with a RBER greater than or equal to the given RBER.

Figure 5B:
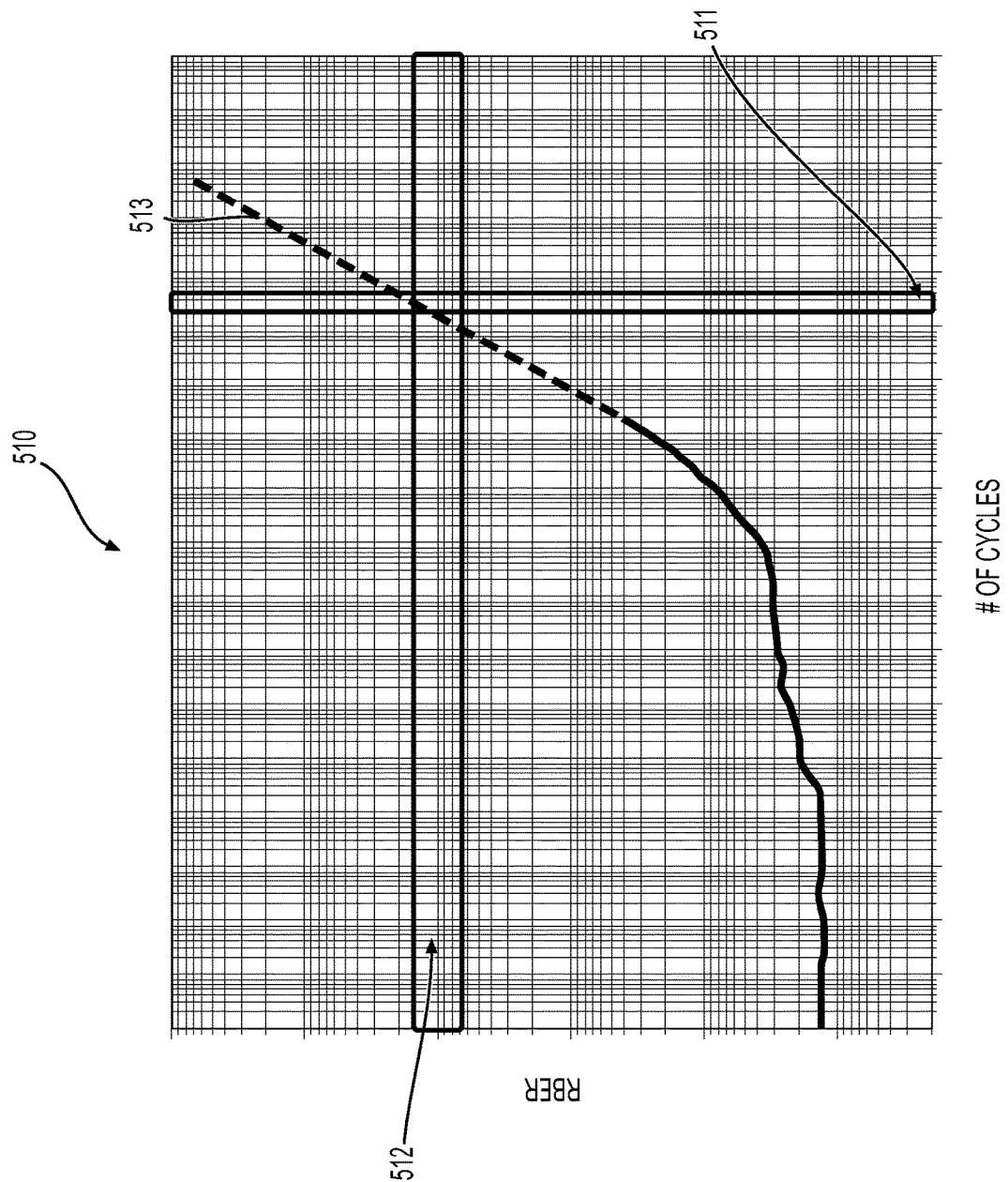
FIG. 5B depicts an exemplary graph illustrating a RBER based on a number of cycles of the memory, according to an aspect of the present disclosure.
Figure 6:
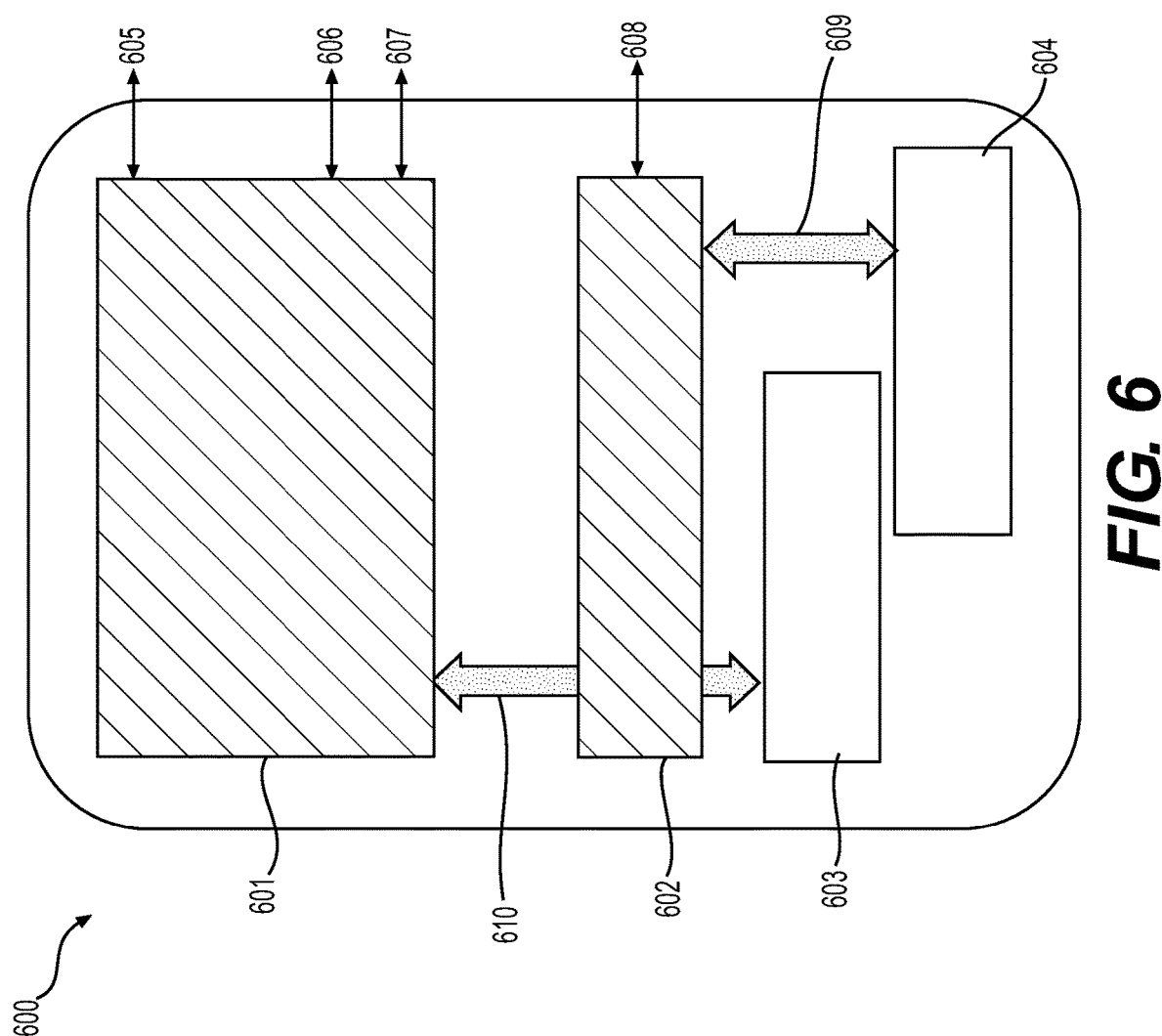
FIG. 6 depicts a block diagram of a memory device, according to an aspect of the present disclosure.

FIG. 5B depicts an exemplary graph 510 illustrating the RBER based on a number of write cycles of the memory. As illustrated in section 512, the BISR trigger threshold may occur near a given RBER. Thus, the intersection of section 511 and 512 is the area where BISR is triggered often. Line 513 represents an example plot of RBER versus a number of cycles. When the BISR is triggered, a request to access a page will be mapped (e.g., redirected) to a different set of MTJs at a repair page. When the repair page is accessed, the number of cycles is reset to zero, and the curve illustrated in FIG. 5B is written again using the repair page. Thus, an endurance lifetime of the memory is increased. For example, with 96 repair pages, any single page access may be repaired 96 times, extending an endurance lifetime by approximately two orders of magnitude FIG. 6 depicts a block diagram of a memory device 600, according to an exemplary embodiment of the present disclosure. As illustrated in FIG. 6, the memory device 600 may include a main array 601, a mini-array 602, a data path 603 with ECC, a communication interface 610 between the data path 603 and the main array 601, a data path 604 with ECC, and a communication interface 609 between the data path 604 and the mini-array 602.

The main array may include main memory 605 with a number of repair pages (e.g., 96 repair pages). The main array may include a non-volatile config bits array 606 and a one-time programmable (OTP) array 607, both of which may not include a BISR function. The main array may include continuous user access with an endurance of 1 e10 memory cycles. The main array may be user accessible, and may include ECC having DEC-TED and SEC.

According to an exemplary embodiment, the mini-array 602 may be an MTJ mini-array for storing a BISR map table 608. The mini-array 602 may be separated from the main array. For example, the mini-array may include a separate data path from the main array, a separate ECC from the main array, separate wordline drivers from the main array, and/or separate write drivers from the main array, etc. By providing the mini-array with separate components, if a BISR is triggered, the mini-array 602 may perform the updating the map table in parallel to the operations of the main array 601 writing-back the contents from a target address to a repair address.

According to an exemplary embodiment, the mini-array 602 may not be accessible by a user. Thus, the ECC of the mini-array may not have repair capability and may not include two-layer correction. When the BISR map table is updated, each row of the BISR map table may be updated. Thus, to reduce latency, the mini-array 602 (e.g., BISR map table 608) may be stored in non-volatile memory, and may only be read and corrected during a power-up of the memory device. Because the mini-array 602 may only be read and corrected during a power-up, the endurance of the mini-array 602 may not be required to be as high as the main array 601.

Figure 7:
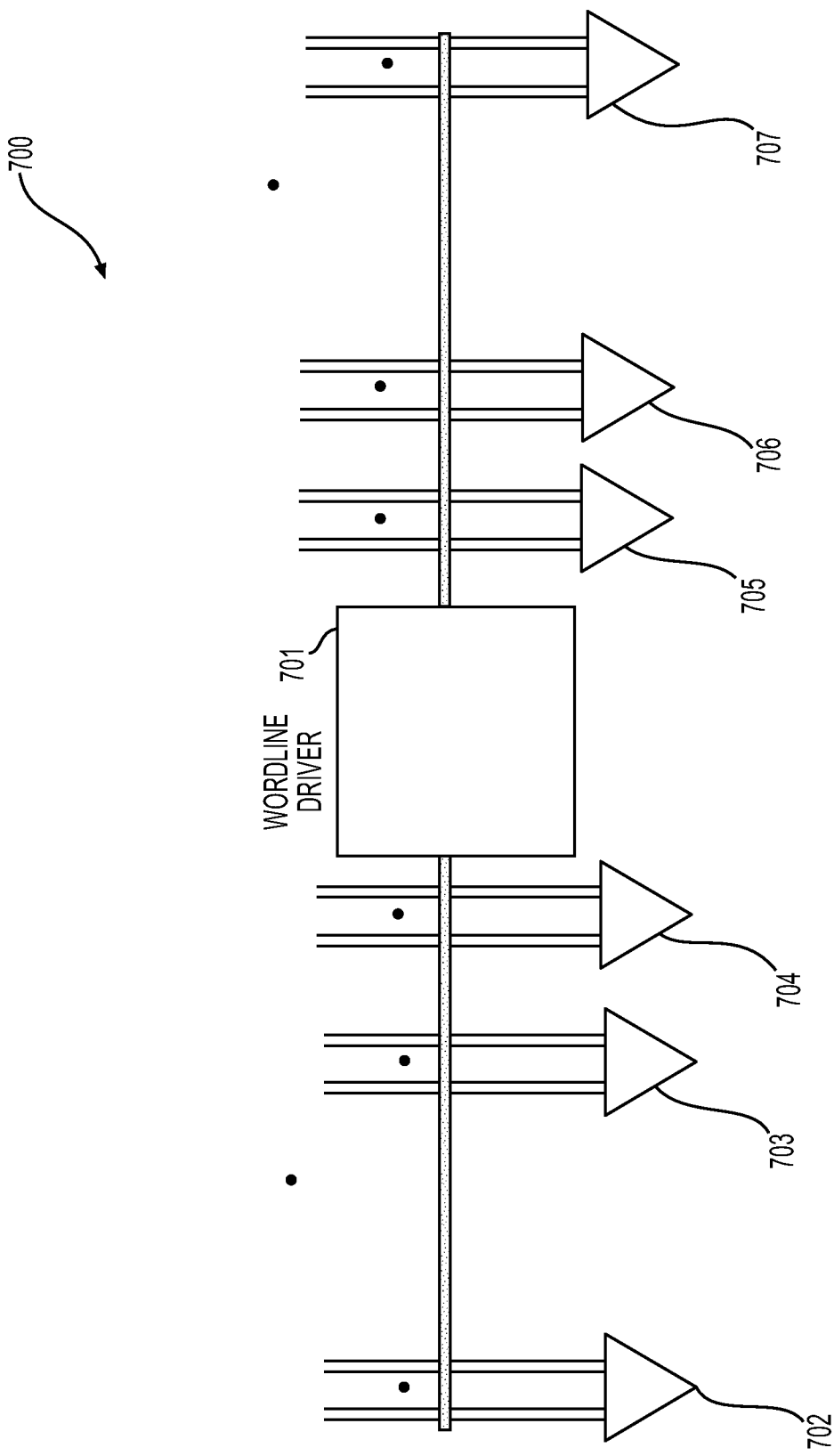
FIG. 7 depicts an exemplary driving circuit for a mini-array, according to an aspect of the present disclosure.

FIG. 7 depicts an exemplary driving circuit 700 for a mini-array. For example, the mini-array may include a wordline driver 701, and senseamp and write drivers 702, 703, 704, 705, 706, and 707. The senseamp and write drivers may operate in parallel. The mini-array may have redundancy for time-0 repair. For example, there may be 8 wordlines, and it may be determined which of the 8 wordlines should be used for performance reasons. When the BISR is triggered during normal operations, one wordline in the mini-array may be activated to update one entry in the BISR map table. One entry may correspond to one repair address mapped for the repair page using DEC-TED. There may be one entry in the BISR map table for each repair row. For example, if there are 96 entries in the BISR map table, there may be 96 repair rows.

Figure 8:
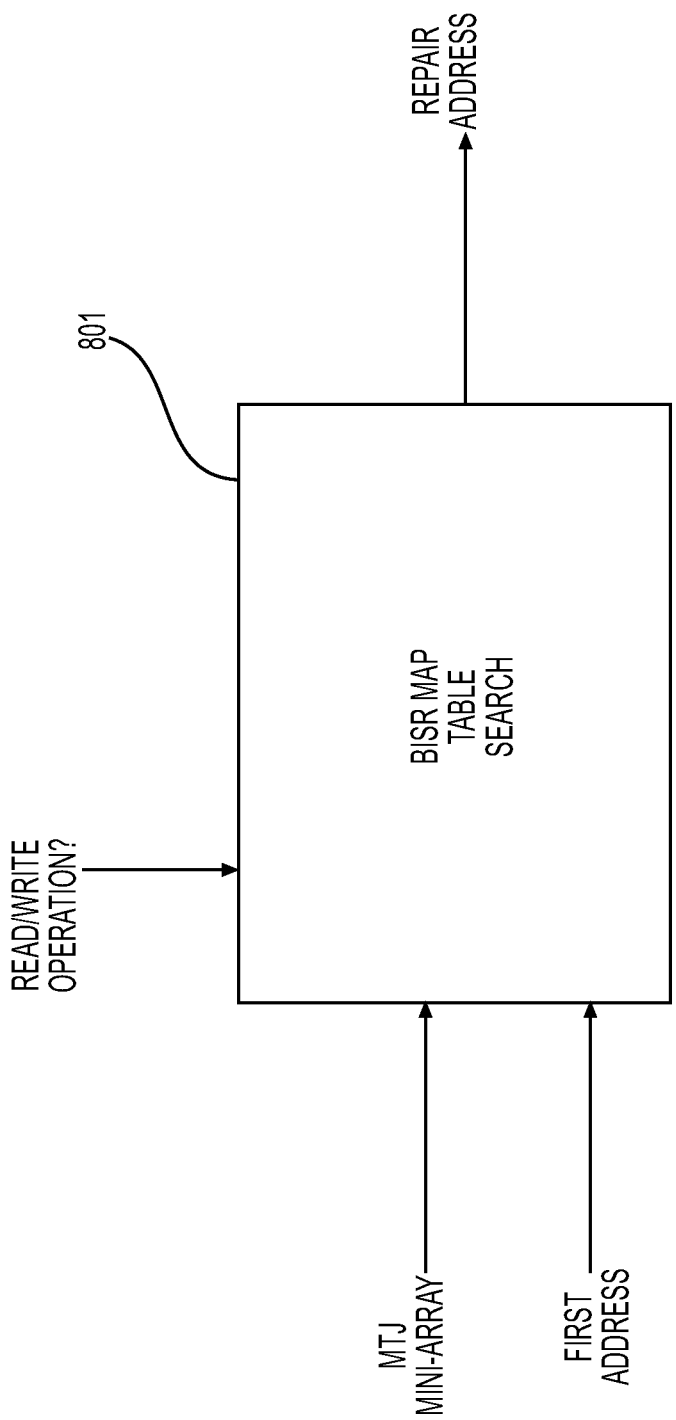
FIG. 8 depicts an exemplary method for a BISR map table search function, according to an aspect of the present disclosure.

FIG. 8 depicts an exemplary method for a BISR map table search function 801. Inputs to the BISR map table search function may include a map table from an MTJ mini-array and a first address in a regular page of memory. While powering up a memory device, the map table from the MTJ mini-array may be read into a plurality of registers. When a read or write operation is performed, the BISR map table search function may search an MTJ mini-array to determine whether a first address is mapped in the BISR map table. If the first address is mapped in the BISR map table, then the BISR map table search function may output the repair address to which the first address is mapped.

Figure 9:
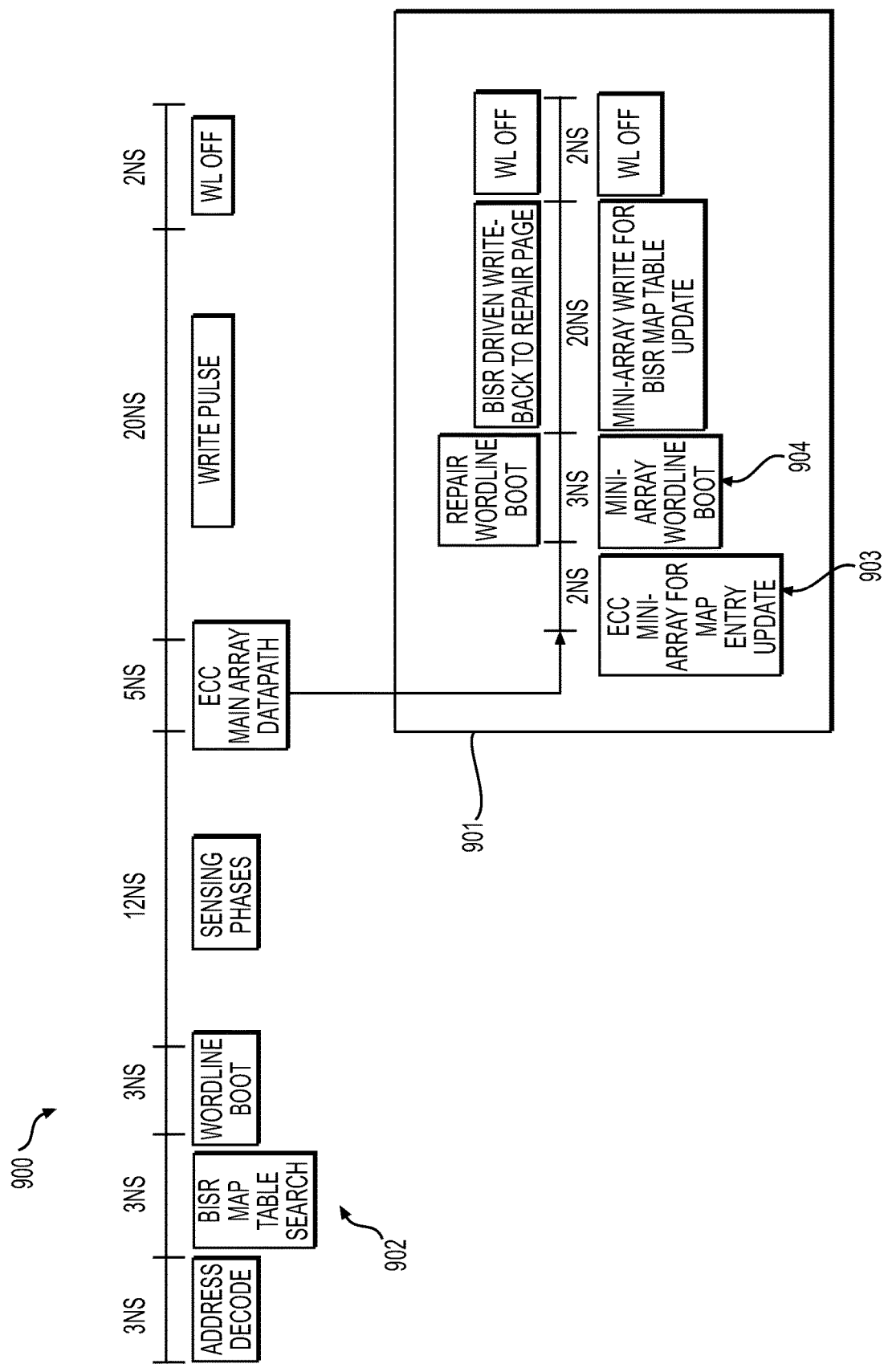
FIG. 9 depicts an exemplary timing diagram for an exemplary method of BISR for a memory device, according to an aspect of the present disclosure.

FIG. 9 depicts an exemplary timing diagram 900 for an exemplary method of BISR for a memory device. The top line of the timing diagram may refer to a timing of the memory device in a situation in which the BISR is not triggered. Box 901 illustrates an exemplary method if the BISR is triggered. For example, if the BISR is triggered, step 903 may include using the ECC mini-array for map entry update (e.g., 2 ns), and step 904 may include the repair wordline boot occurring in parallel with the mini-array wordline boot (e.g., 3 ns). The BISR driven write-back to a repair page may occur in parallel with the mini-array write for BISR map table update (e.g., 20 ns), and then the wordline (WL) may be turned off (e.g., 2 ns). Additionally, step 902 may include a BISR map table search function (e.g., 3 ns). Thus, according to an exemplary method, if the BISR is triggered, the process may take approximately 8 ns longer than if the BISR is not triggered. Accordingly, an advantage of an exemplary BISR method of the present disclosure is that additional time may be minimized by enabling parallel operation using the mini-array and the map table update function. Additionally, die size adder may be minimized (e.g., 5-10% die size adder) because the mini-array, the BISR map table search, and the ECC may be adders.

Figure 10:
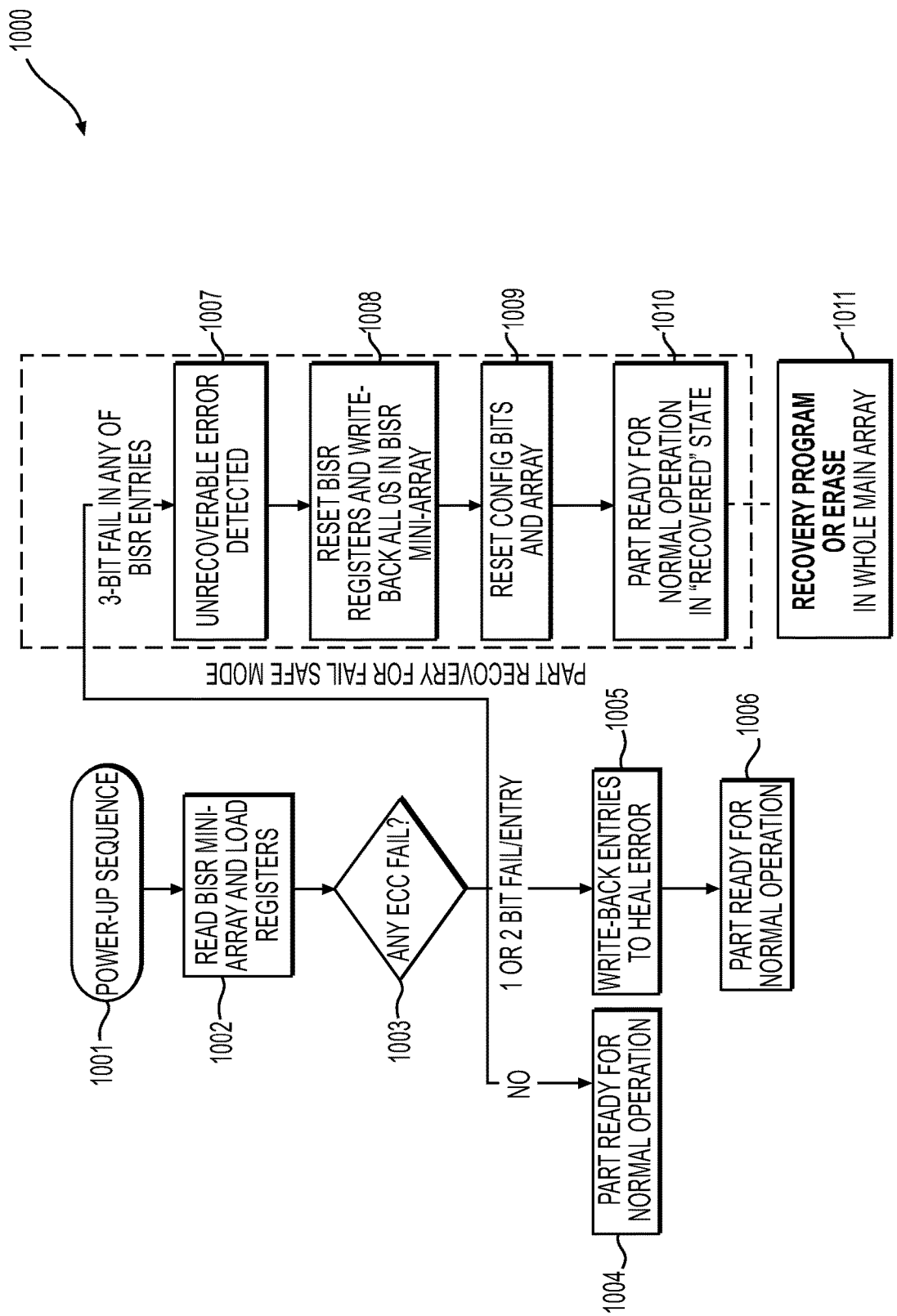
FIG. 10 depicts an exemplary method of an initialization process for BISR for a memory device, according to an aspect of the present disclosure.

FIG. 10 depicts an exemplary method 1000 of an initialization process for BISR for a memory device, according to an exemplary embodiment. For example, in step 1001, the method may include beginning a power-up sequence for a memory device. In step 1002, the method may include reading the BISR map table from the mini-array and loading into the registers.

In step 1003, the method may include determining whether there is a failure in any of the BISR entries from the BISR map table. If it is determined that there is no bit failure in any of the words, the method may include determining that the part is ready for normal operation (e.g., step 1004). If it is determined that there is a one-bit or two-bit fail in any of the BISR entries from the BISR map table, the fail may be corrected by writing-back entries to correct the error (e.g., step 1005) and the part may be ready for normal operation (e.g., step 1006). If it is determined that there is a three-bit fail in any of the BISR entries from the BISR map table, then an unrecoverable error has been detected (e.g., step 1007), and the method may include informing a user there is a problem with the BISR map table and triggering a part recovery for fail-safe mode. Example events that may trigger a part recovery for a fail-safe mode may include a magnetic field disturbance or excessive heat.

An unrecoverable ECC fail may occur with the BISR map table (e.g., reflow or external magnet). The memory may be powered up in the fail-safe mode to allow recovery and part initialization. The process of recovering the part may include setting an initialization bit (e.g., in config register). For example, if the initialization bit is set to 1, the BISR may be temporarily disabled while writing a memory background. The BISR registers may be reset and zeroes may be written-back in the BISR mini-array (e.g., step 1008). Although the stored data is lost, the BISR capability may be maintained. The recovery may include resetting config bits to a known state and the BISR map table (e.g., step 1009), determining the part is ready for normal operation in a recovered state (e.g., step 1010). In step 1011, if there is no BISR trigger, i.e. factory initialization bit=1, the memory may be programmed with zeroes and/or the memory may be erased.

Under certain circumstances, BISR page replacement may occur due to soft error bits or by endurance failure bits. Soft error bits may be bits that can be corrected (e.g., using ECC) or that are misidentified as endurance failure bits. Endurance failure bits may result from hard failures that cannot be corrected (e.g., using ECC). Soft error bits may be misidentified as endurance failure bits during operation of a memory device above a threshold temperature. For example, operating a memory device above a threshold temperature (e.g., 50° C.) may result in mistaken error detection when compared to temperatures below the threshold temperature.

BISR page replacement based on soft error bits may waste replacement pages. The soft error bits could be corrected and may be incorrectly identified as endurance failure bits. Wasted replacement pages may reduce overall performance and longevity of a memory device as the memory device may be inoperable or have limited operation after the number of available replacement pages is reduced to zero. Accordingly, techniques disclosed herein are directed to reducing replacement page waste.

According to an implementation, TED for a given page may be set to a threshold value such that BISR page replacement due to soft error bits is reduced. For example, the number of TED during multiple read or write cycles for a given page may be a value greater than one, and may be two, three, or more such that BISR is triggered upon detection of two, three, or more uncorrectable errors during multiple read or write cycles. Using this technique, a bit error may be probabilistically verified as an endurance failure bit prior to activating BISR based on the bit error. By increasing the threshold value (e.g., to two, three, or more), the probability of the bit error being a soft error bit may be reduced.

Figure 11:
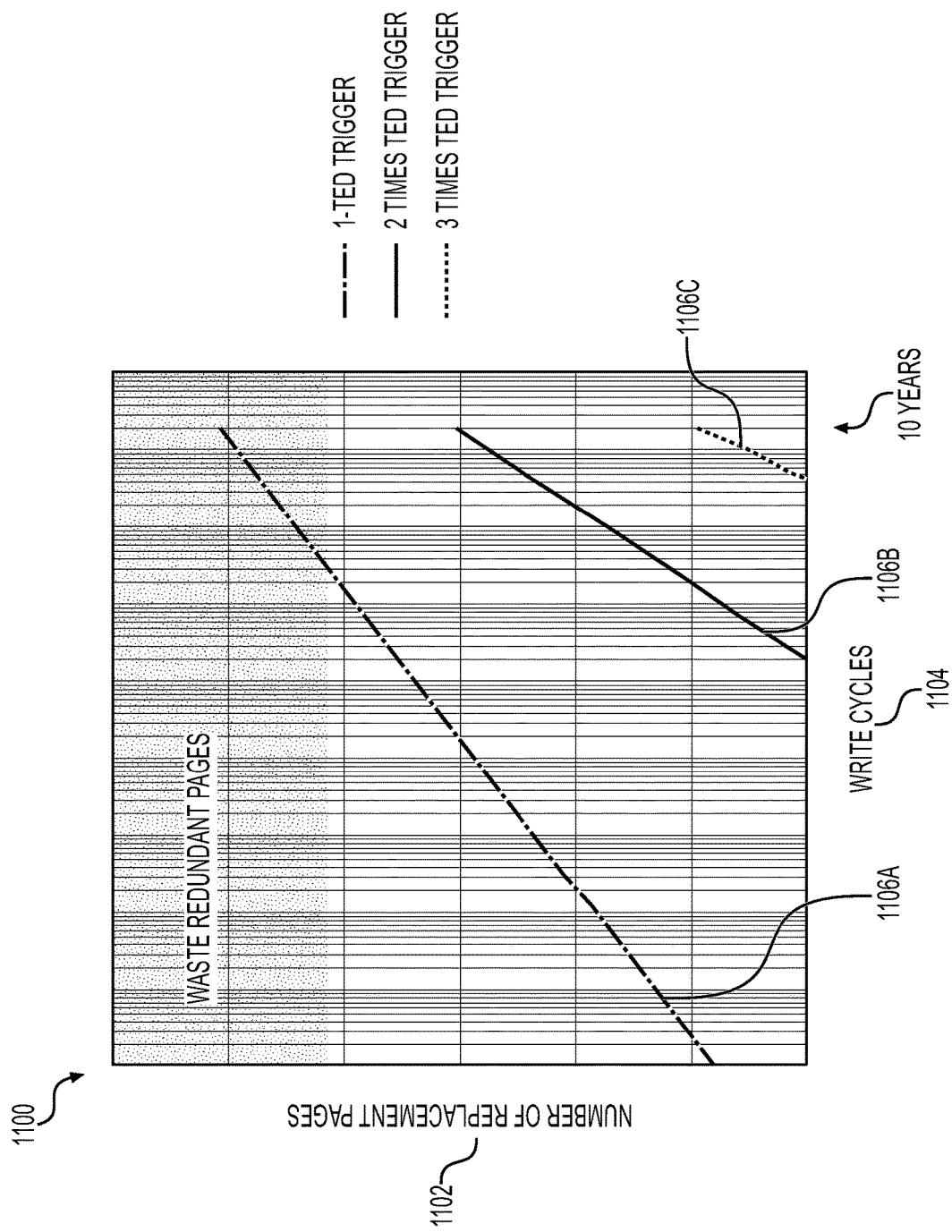
FIG. 11 depicts an exemplary graph illustrating varying thresholds for error detection, according to an aspect of the present disclosure.

FIG. 11 depicts an exemplary graph 1100 illustrating varying thresholds for error detection. A number of replacement pages (e.g., 96) 1102 may be available at a given memory device that corresponds to graph 1100. The repair pages may be probabilistically used over a number of write cycles 1104. A number of replacement pages using a single error detection 1106A TED may probabilistically enter a waste redundant pages amount. Accordingly, by using the single error detection 1106A TED, it is likely that a number of write cycles over a life span of the given memory device (e.g., 10 years) may require a number of redundant pages in excess of those available in the given memory device. As shown, using a single error detection 1106A TED may cross into the wasted redundant pages zone in advance of the expected life span of the given memory device (e.g., 10 years).

Single error detection 1106A TED based redundant pages may cross into the wasted redundant pages zone in advance of a device life span (e.g., 10 years) because by setting the threshold for generating a redundant page after a single error, redundant pages may be generated based on both soft errors and endurance failure bits. Accordingly, the likelihood of generating a redundant page may be higher when using single error detection, when compared to using a double, triple, or greater detection. The likelihood may decrease by using a double, triple, or greater error detection because a soft error may present during a first error detection cycle but may resolve itself during a subsequent error detection cycle. Accordingly, by requiring a higher number of detected errors, the probability of identifying a soft error as an endurance failure may reduce.

Double error detection 1106B TED, as shown in FIG. 11, may require fewer replacement pages than single error detection 1106A TED. As discussed above, by implementing double error detection 1106B TED, the number of soft errors identified as endurance failures may be less than single error detection 1106A TED. Similarly, as shown in FIG. 11, triple error detection 1106C TED may require fewer replacement pages than single error detection 1106A TED and/or double error detection 1106B TED. As discussed above, a higher TED value may result in fewer soft errors being designated as endurance failures. Accordingly, the number of replacement pages generated based on a higher TED value may be less than the number of replacement pages generated based on a relatively lower TED value. As shown in FIG. 11, the number of replacement pages needed using double error detection 1106B TED or triple error detection 1106C TED may be less than the wasted redundant page amount. Additionally, the number of replacement pages needed using double error detection 1106B TED or triple error detection 1106C TED during a memory device's expected life cycle (e.g., 10 years) may be less than the wasted redundant page amount.

As discussed above, soft error bits may be misidentified as endurance failure bits during operation of a memory device above a threshold temperature. For example, operating a memory device above a threshold temperature (e.g., 50° C.) may result in mistaken error detection when compared to temperatures below the threshold temperature. Temperatures above a threshold temperature (e.g., 25° C., 50° C., etc.) may cause higher sensing error rates such that replacement pages may be unnecessarily used to address the sensing errors. Such sensing errors and resulting use of replacement pages may reduce the lifespan of a given memory device as an available number of replacement pages may be exhausted, including those used due to sensing errors in high temperature environments, prior to the expected lifecycle of the memory device.

FIG. 12 depicts an exemplary graph 1200 illustrating temperature effects on error detection. Graph 1200 includes a page replacement probability 1202 over write cycles 1204. As shown, the page replacement probability 1202 as a factor of write cycles 1204 during high temperatures 1206A is higher than the page replacement probability 1202 as a factor of write cycles 1204 during relatively low temperatures 1206B. It will be understood that the page replacement probability at a certain temperature (e.g., a threshold temperature) may remain constant over write cycles 1204 such that at or below the certain temperature, the likelihood of temperature-based sensing errors may be significantly reduced, e.g., be reduced to at or near zero.

Therefore, according to implementations of the disclosed subject matter, a temperature threshold may be applied during error detection. The temperature threshold may be applied such that error detection (e.g., TED) during temperatures above a threshold temperature may be treated differently than error detection during temperatures at or below the threshold temperature. Temperatures used during error detection may correspond to chip temperatures, circuit temperatures, ambient temperatures, or the like.

According to an implementation, error detection during temperatures above a threshold temperature may be paused for a duration of time until the temperature is reduced to at or below the threshold temperature. For example, a temperature sensor may generate a signal indicating that a chip temperature is above a temperature threshold of 50° C. Accordingly, any endurance failure bits identified while the temperature is above the temperature threshold of 50° C. may not be recorded as endurance failure bits. A subsequent check to detect the endurance failure bits may be conducted after the temperature sensor indicates that the temperature is below the temperature threshold.

According to an implementation, a threshold value for TED may be adjusted based on a temperature threshold. The threshold value for TED may increase based on a sensed temperature being above the temperature threshold. For example, a temperature sensor may generate a signal indicating that a circuit temperature is above a temperature threshold of 25° C. Accordingly, a current dual TED arrangement (e.g., an arrangement that requires two errors before generating a replacement page) may be updated to a triple TED arrangement (e.g., an arrangement that requires three errors before generating a replacement page), based on the temperature being above the temperature threshold. According to this implementation, the likelihood of a misidentified error (e.g., a soft error) may reduce as a greater level of confirmation (e.g., triple detection instead of double detection) may be implemented. Accordingly, a temperature threshold may be applied to reduce the likelihood of generating replacement pages due to soft errors, by either deactivating error detection while the temperature is above a threshold temperature and/or increasing the TED category.

Figure 13A:
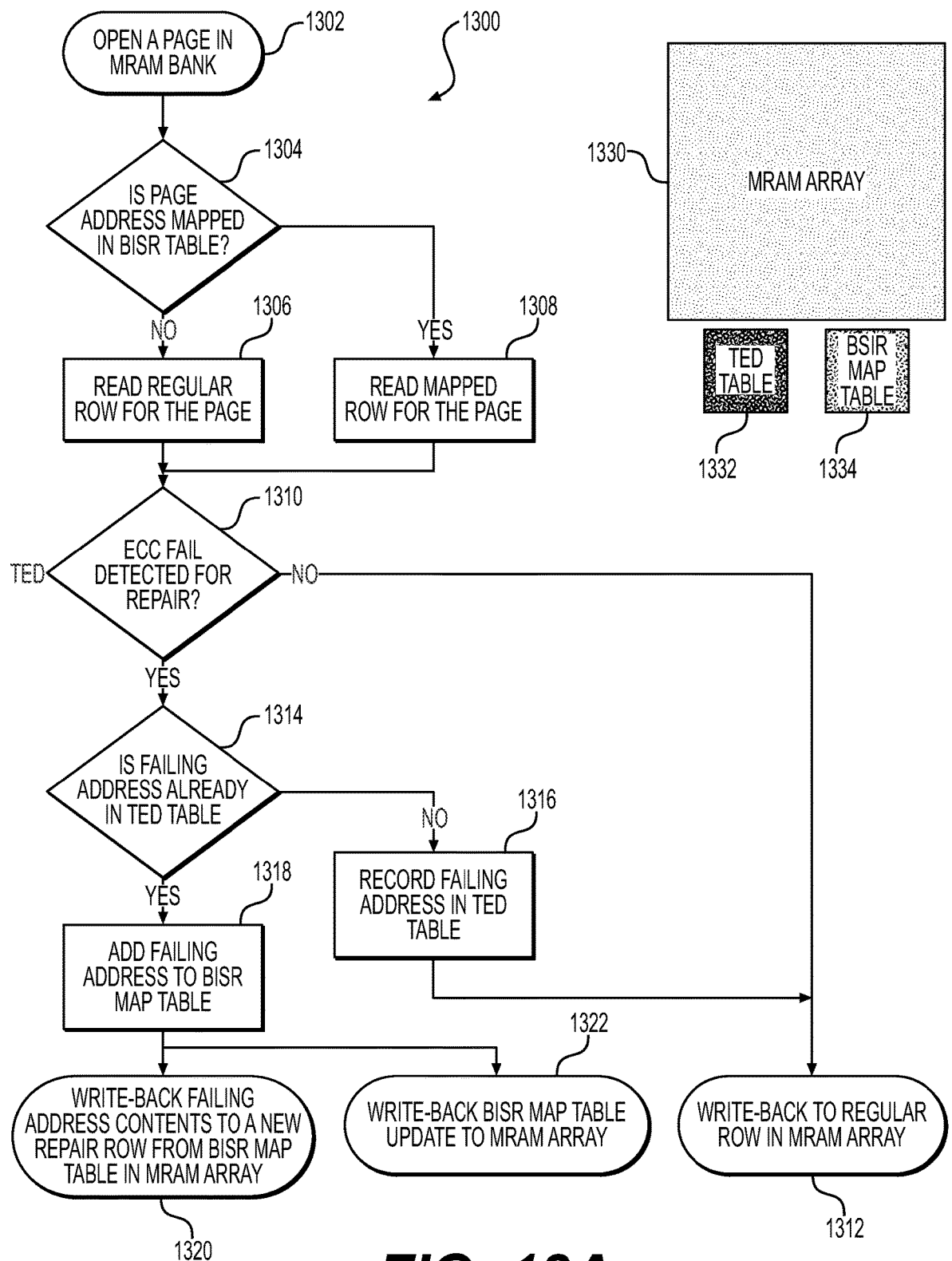
FIG. 13A depicts an exemplary flow diagram for threshold based BISR, according to an aspect of the present disclosure.
Figure 13B:
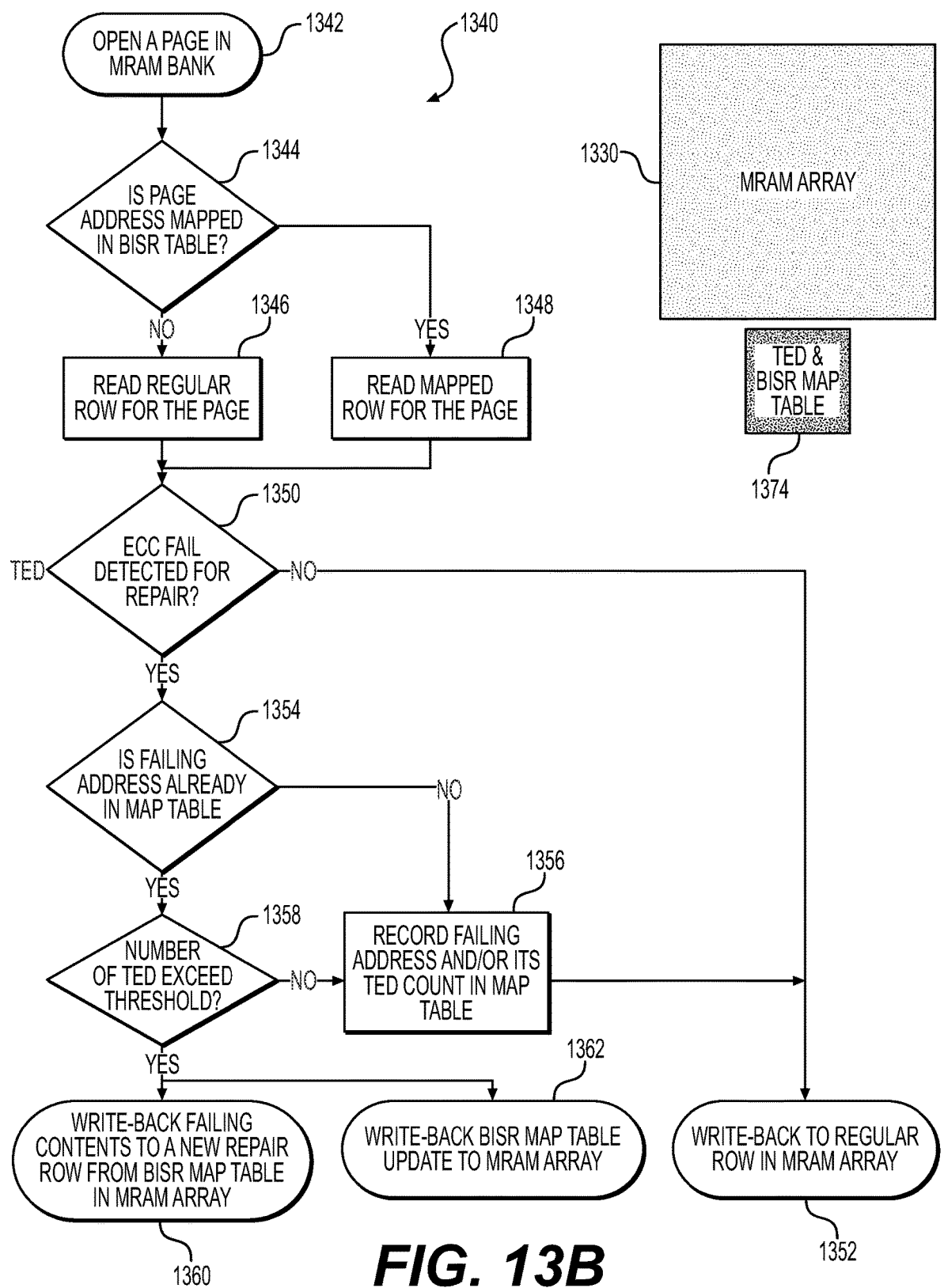
FIG. 13B depicts another exemplary flow diagram for threshold based BISR, according to an aspect of the present disclosure.

FIGS. 13A and 13B depict exemplary flow diagrams for threshold based BISR. FIG. 13A shows a dual TED implementation with a separate TED table 1332 and BISR map table 1334 in communication with MRAM array 1330. As shown in flow diagram 1300 of FIG. 13A, at 1302 a page in an MRAM bank may be opened. At 1304, a determination may be made whether the page opened at 1302 has a page address mapped in BISR map table 1334. If the page address is mapped in the BISR map table 1334, then the actual page address corresponds to the mapped row for the page, and is read at 1308. If the page address is not mapped in the BISR map table 1334, then the actual page address corresponds to the regular (e.g., original) row for the page, and is read at 1306.

At 1310, a determination is made whether an ECC fail is detected for repair. If no ECC fail is detected, then a write-back operation is completed at the regular (e.g., original) row in MRAM array 1330, at 1312. If an ECC fail is detected at 1310, then a determination is made regarding whether the failing address is already in the TED table 1332, at 1314. If the failing address is not in TED table 1332, then the failing address is recorded in TED table 1332, at 1316, and a write-back operation is completed at the regular (e.g., original) row in MRAM array 1330, at 1312. Accordingly, in the absence of a failing address already being in TED table 1332, the failing address cannot meet the dual TED requirement and, thus, no repair row is generated.

If the failing address is in TED table 1332, then the failing address is also recorded in BISR map table 1334 registers, at 1318. BISR map table 1334 may include a mini MRAM array and one or more registers. Information from BISR map table 1334 mini MRAM array may be loaded into the BISR map table 1334 registers, such that both may hold the same information. BISR map table 1334 mini MRAM array may be non-volatile and BISR map table 1334 registers may be volatile. TED table 1332 may also include a mini MRAM array and TED registers. Additionally, at 1320, the failing address contents are written-back to a new repair row based on the BISR map table 1334. Additionally, at 1322, the BISR map table update is written back to the BISR map table 1334 mini MRAM array at 1332. Accordingly, in the dual TED implementation of FIG. 13A, if a failing address is already recorded in TED table 1332, it is understood that the failing address meets the dual TED requirement (i.e., an original fail that resulted in the failing address to be recorded in TED table 1332 and a subsequent (e.g., current) fail). As a result of the fail, the content of the failing address is written in a replacement page. TED table 1332 may include page addresses that experience TED. TED table 1332 may not include other page addresses, reducing the amount of memory space required for the TED table 1332.

FIG. 13B shows a multiple TED implementation with a joint TED and BISR map table 1374 in communication with MRAM array 1330. Joint TED and BISR map table 1374 may store page addresses (e.g., original and/or repair page addresses) with a 2-bit TED counter. As shown in flow diagram 1340 of FIG. 13B, at 1342 a page in an MRAM bank may be opened. At 1344, a determination may be made whether the page opened at 1342 has a page address mapped in joint TED and BISR map table 1374. If the page address is mapped in joint TED and BISR map table 1374, then the actual page address corresponds to the mapped row for the page and is read at 1348. If the page address is not mapped in joint TED and BISR map table 1374, then the actual page address corresponds to the regular (e.g., original) row for the page, and is read at 1346.

At 1350, a determination is made whether an ECC fail is detected for repair. If no ECC fail is detected, then a write-back operation is completed at the regular (e.g., original) row in MRAM array 1330, at 1352. If an ECC fail is detected at 1350, then a determination is made regarding whether the failing address is already in joint TED and BISR map table 1374, at 1354. If the failing address is not in joint TED and BISR map table 1374, then the failing address is recorded in joint TED and BISR map table 1374, at 1356, and a write-back operation is completed at the regular (e.g., original) row in MRAM array 1330, at 1352. Accordingly, in the absence of a failing address already being in joint TED and BISR map table 1374, the failing address cannot meet the multiple TED requirement and, thus, no repair row is generated.

If the failing address is in joint TED and BISR map table 1374, then, at 1358, a determination is made whether the number of times that the failing address is recorded in joint TED and BISR map table 1374 meets or exceeds a threshold error value. If the number of times that the failing address is recorded in joint TED and BISR map table 1374 does not meet or exceed the threshold error value, then the failing address is recorded in joint TED and BISR map table 1374 at 1356 and content is written-back to the regular (e.g., original) row in MRAM array 1330.

If the number of times that the failing address is recorded in joint TED and BISR map table 1374 meets or exceeds the threshold error value, then the failing address contents are written-back to a new repair row based on the joint TED and BISR map table 1374 in MRAM array 1330, at 1360. Additionally, the BISR map table register update is written back to the BSIR map table 1374 mini MRAM array at 1362. Accordingly, in the multiple TED implementation of FIG. 13B, if a failing address is already recorded in joint TED and BISR map table 1374 a threshold error value number of times, it is understood that the failing address meets the multiple TED requirement (i.e., a threshold error value number of fails that resulted in the failing address to be recorded in joint TED and BISR map table 1374, including current fail). As a result of the fail, the content of the failing address is written in a replacement page.

According to implementations of the disclosed subject matter, STT-MRAM memory may meet scaling challenges by providing high density memory within package size limitations and with support for differentiating features. Techniques provided herein improve bit efficiency with midpoint and/or self-referenced sensing. Such efficiencies may provide endurance that is better than NOR and/or near or at unlimited endurance.

According to implementations, a memory array (e.g., an STT-MRAM array) may be organized into pages including a plurality of words (e.g., ECC words). Each word may further include an inversion bit that indicates whether all the bits in a given word are stored in a true or invented stated in the memory array or corresponding cache (each referred to herein as a memory array for simplicity). As discussed herein, the memory array may include a repair array such that pages from a main array can be relocated to the repair array if a BISR operation is triggered. For example, upon detecting an uncorrectable error in a word, a re-writing operation may re-write the word in a repair array page and a mapping table may direct the word to the repaired word for read and/or write operations.

In accordance with an inversion bit based implementation, in response to a read command, a fast read latency operation may be implemented. The method may be implemented using midpoint sensing and/or self-sensing (i.e., self-referenced sensing). Midpoint sensing may include identifying a voltage value that clearly distinguishes whether a given MTJ is in a high state or low state. Mid-point sensing may be implemented by determining a voltage value that is a threshold amount above the low state voltage value and/or a threshold amount below a high state voltage value. Midpoint sensing may be implemented where the threshold voltage can be clearly identified such that the probability of a high state being below the threshold voltage and/or the probability of a low state being above the threshold voltage is materially zero. Self-sensing may be a variation tolerant technique for reading a small bitcell with no stringent requirement on MTJ Rsigma and transistor variation. For self-sensing, an MTJ magnetoresistance (MR) requirement may be lower than 100%. In self-sensing, unused pages in a repair array may be written to a low state during power-up.

A midpoint sensed or self-sensed read command may be supplemented with ECC correction, as disclosed herein. Although an error may trigger a recordation (e.g., in a TED table), according to an implementation, no BISR may be triggered as a result of a read command.

In accordance with the inversion bit-based implementation, a write command may be received. The write command may be associated with an address (e.g., an ECC word address). Receiving the write command may trigger a write action to bias all MTJs associated with the address to a high state. Each of the MTJs may be biased with a voltage such that each of their resistance values are configured to enter a high state.

A sensing operation may be implemented by sensing the state of each of the MTJs associated with the address using, for example, a trim mable reference voltage to identify low resistance MTJs. For simplicity, an MTJ, as referenced herein, may be a group of MTJs connected together. Low resistance MTJs (e.g., uncorrectable error bits) may be present due to large variation causing overlapping high and low sate MTJ resistance distribution. Alternatively, or in addition, low resistance MTJs may be present due to repeated cycling, resistance drift, and/or breakdown. The sensing operation may be conducted without ECC correction such that the sensed output is a true output. If the result of the sensing operation is that each of the MTJs is in a high state (e.g., not in a low state), then a determination may be made that no error correction (e.g., inversion bit-based error correction) is needed. Each of the MTJs being in a high state may indicate that each of the MTJs is operating as expected. In this case, the inversion bit may be set to indicate a true state. Additionally, in this case, the write command may be completed by writing to the address.

If one or more low resistance MTJs (e.g., uncorrectable MTJs) are identified as a result of the sensing operation, then the number of identified low resistance MTJs may be compared to a threshold number of low resistance MTJs. The threshold number of low resistance MTJs may be, for example, one MTJ, two MTJs, or more. The number of threshold MTJs may be determined based on the ECC capabilities of a given device (e.g., levels of ECC). For simplicity, the threshold number of low resistance MTJs discussed further herein is a single low resistance MTJ. However, it will be understood that the inversion bit-based disclosure provided herein may be implemented using any number of threshold low resistance MTJs.

Accordingly, if a single low resistance MTJ (or a number of low resistance MTJs below a threshold amount) is identified as a result of the sensing operation, then that single MTJ may be designated an uncorrectable endurance failure bit. Accordingly, the inversion bit may be written such that the single low resistance MTJ is always written to a low state. For example, if a write command includes data that requires the single low resistance MTJ to be in a high state (e.g., a 1), the system may reverse the entire write command data such that the write command data is inverted and, accordingly, the single low resistance MTJ can remain in the low state while representing the reversed data. Additionally, the inversion bit may be configured to indicate an inverted state instead of the true state. By reversing the entire write command data and configuring the inversion bit to indicate an inverted state, the write command may be implemented by incorporating the single low resistance MTJ. For example, a subsequent read command may detect the inversion bit indicating an inverted state and, based on the identification, may output a corrected (e.g., re-reversed) version of the inverted written data.

Accordingly, by applying an inversion bit, a single low resistance MTJ may not cause or require a BISR trigger as the single low resistance MTJ can be used in conjunction with the inversion bit. By applying ECC and/or an inversion bit, bit efficiency is improved. For example, by using midpoint sensing and a simpler ECC (e.g., single bit error correction), the number of bits used for correction may be reduced. Such a reduction may increase memory density in a memory package while allowing for fast read latency, faster than NOR write latency, and/or increased endurance.

According to a self-sensing read operation, a read command may be received. Self-sensing may be triggered for MTJs in the page to be read, based on the read command. The MTJs may be written to a low state during the self-sensing process. ECC may be applied to the read data. BISR may be triggered if there is an uncorrectable error or if the number of correctable errors meets or exceeds a threshold value (e.g., a two bit error in a double error correction ECC word). Based on BISR being triggered, the given page may be written back to an unused location in a repair array.

No BISR may be triggered if there is a correctable error less than the threshold. Accordingly, the given page may be written with any corrected data, within a main array. The write back if BISR is or is not triggered may be performed using a write 1 operation to the corresponding MTJs. As disclosed herein, an inversion bit may be used to minimize the number of write 1s in any ECC word during a given write back.

According to a self-sensing write operation, a write command may be received. Self-sensing may be triggered for MTJs in the page to be written, based on the write command. The MTJs may be written to a low state during the self-sensing process. ECC may be applied to the read data. BISR may be triggered if there is an uncorrectable error or if the number of correctable errors meets or exceeds a threshold value (e.g., a two bit error in a double error correction ECC word). Based on BISR being triggered, the data corresponding to the write command may be written to an unused location in a repair array.

No BISR may be triggered if there is a correctable error less than the threshold. Accordingly, the given page may be written with data from the write command, within a main array. The write if BISR is or is not triggered may be performed using a write 1 operation to the corresponding MTJs. As disclosed herein, an inversion bit may be used to minimize the number of write 1s in any ECC word during a given write command.

During self-sensing, an unused repair array may be reset to low states during power-up and the number of correctable errors at max threshold may be used for triggering BISR. This technique may enable BISR to be performed within the latency of self-referenced read or write operation.

Figure 14:
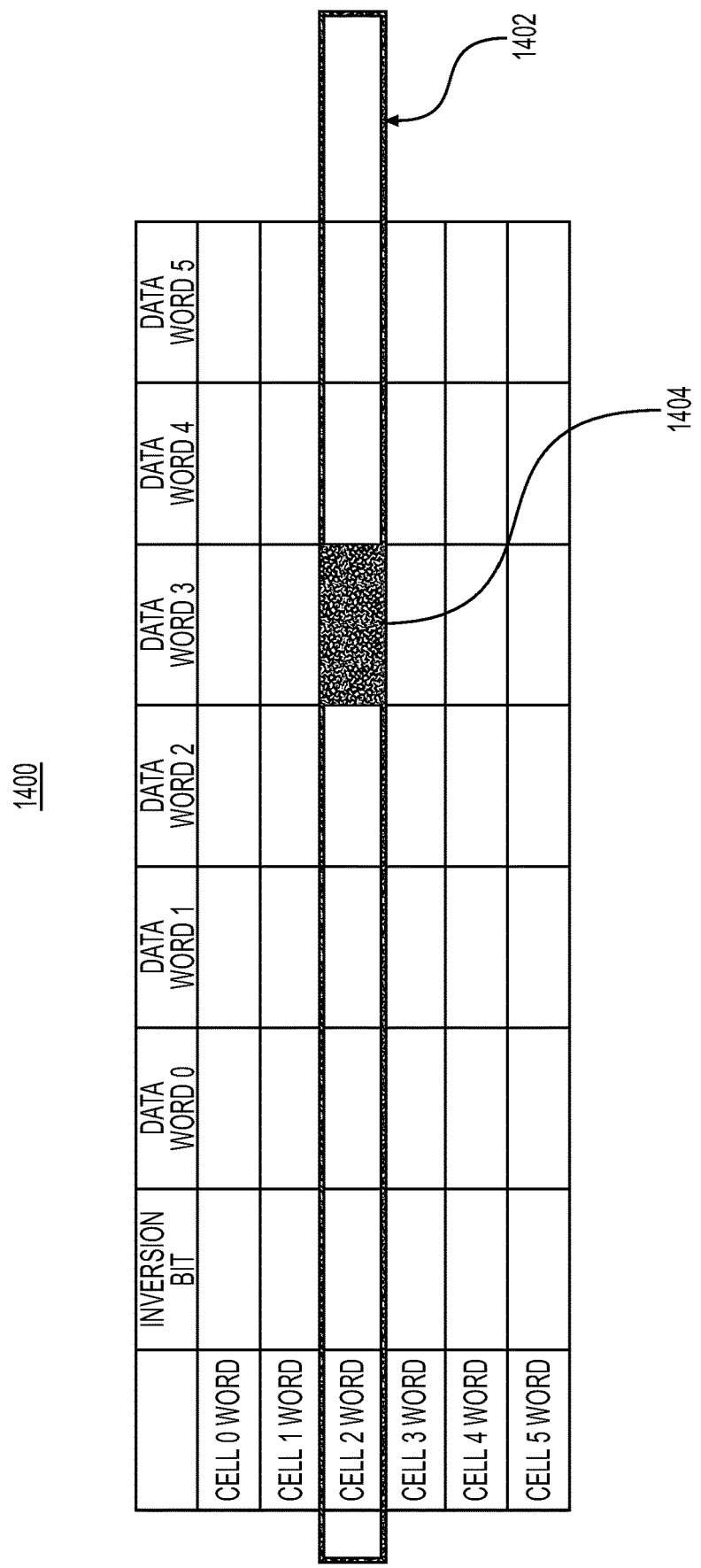
FIG. 14 depicts a data page with an inversion bit, according to an aspect of the present disclosure.

FIG. 14 depicts a data page 1400 with an inversion bit. As shown in page 1400, each cell word (e.g., for cell 0 through cell 5) may include a corresponding inversion bit. As disclosed herein, the inversion bit may indicate whether the values in the data words (e.g., data words 0 through data word 5) are in their true state or in an inverted state.

According to an example, a write command may be received to write data into cell 2 word. Based on the write command, a write operation to write a high state into each of the MTJs for data words 0-5 of cell 2 words may be initiated. The write operation may be implemented by biasing each of the MTJs with a voltage sufficient to place each of the MTJs in a high resistive state. A sensing operation (e.g., midpoint sensing or self-sensing) may be implemented to verify that each of the MTJs associated with cell 2 word are in a high state. If each of the MTJs are in a high state, then the write command may be fulfilled and the MTJs may be updated to reflect the true value corresponding to the write command.

If the sensing operation detects more than a single low resistance MTJ (or more than a threshold number of low resistance MTJs), then a BISR operation may be triggered. The BISR operation may be triggered because true or inverted values in a word with more than a single low resistance MTJ may not be completely correctable using an inversion bit. For example, in cell word with two uncorrectable bits, data that requires one of the two bits to be a high value and the other to be a low value may not be written using a single inversion bit. The single inversion bit may provide an indication of true values or inverted values and, accordingly, cannot accommodate data that requires a first uncorrectable bit to be a high value and second uncorrectable bit to be a low value at the same time. When the first uncorrectable bit represents a high value, the inversion bit has to be in an inverted state because the first uncorrectable bit is in a low resistive state. However, when the inversion bit indicates an inverted state, the second uncorrectable bit also automatically represents a high state as it is also in a low resistive state. Accordingly, two uncorrectable bits cannot represent two different states by using a single bit inversion bit.

If the sensing operation detects a single low resistance MTJ, such as MTJ 1404 of word 1402, then write command data may be written to cell 2 word. The write command data may be written such that MTJ 1404 is always in a low state. Accordingly, if the write command includes data that requires MTJ 1404 to be in a low state by default, then the write command is written as-is and inversion bit is set to indicate true values for cell 2 word. However, if the write command includes data that requires MTJ 1404 to be in a high state by default, then the write command is written in an inverted manner (e.g., 1s (high states) are converted to 0s (low states) and 0s are converted to 1s). Additionally, inversion bit is set to indicate inverted values for cell 2 word. Accordingly, a subsequent read command may output MTJ 1404 as a low state (e.g., a 0) if the inversion bit indicates a true state (e.g., if the inversion bit indicates a high state or a 1). Conversely, a subsequent read command may output MTJ 1404 as a high state (e.g., a 1) if the inversion bit indicates an inverted state (e.g., if the inversion bit indicates a low state or a 0).

Figure 15:
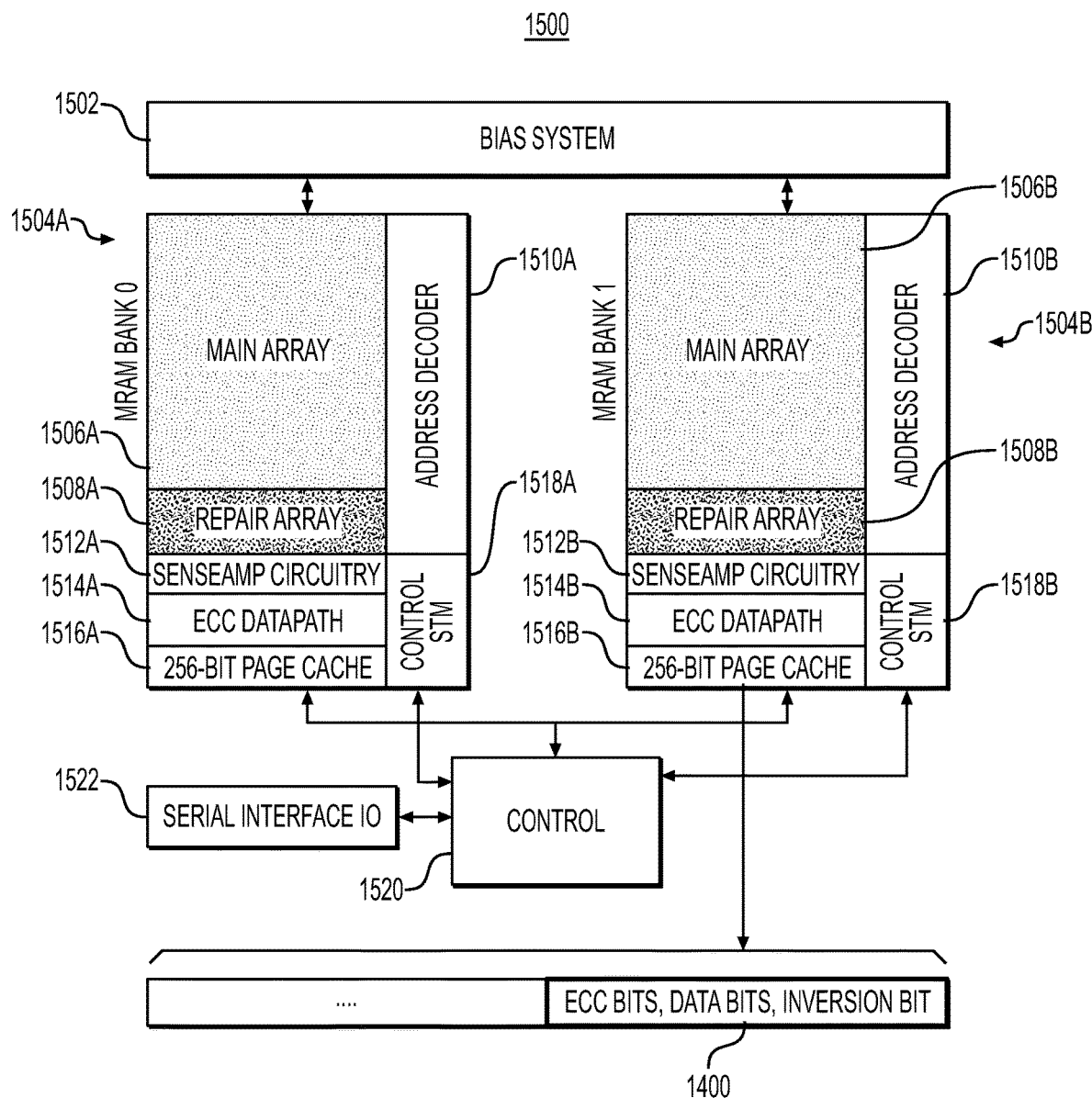
FIG. 15 depicts a block diagram of a memory device, according to an aspect of the present disclosure.

FIG. 15 depicts a block diagram 1500 that may be used to implement an inversion bit. Although two MRAM banks 1504A and 15046 are shown, it will be understood that the techniques disclosed herein may be implemented using any number of memory banks. The MRAM banks 1504A and 15046 may include main arrays 1506A and 1506B, repair arrays 1508A and 1508B, sensing circuitry 1512A and 1512B, ECC data paths 1514A and 1514B, cache 1516A and 1516B pages (e.g., 256-bit pages), address decoders 1510A and 1510B, and control state machines (STMs) 1518A and 1518B, respectively.

MRAM banks 1504A and 1504B may be connected to a bias system 1502 and their components may receive control signals from control 1520. Control 1520 may be in communication with serial interface 1522 (e.g., may be coupled to each other). Read and write/program commands may be received via serial interface 1522 and may be processed by control 1520.

Bias system 1502 may provide standby voltage to main arrays 1506A and 1506B as well as trim settings. Trim settings may be programmed in an eFuse/anti-fuse block at the bias system. The standby voltage may enable operation in a standby mode such that main arrays 1506A and 1506B do not start from an off state upon receiving a read or write command via control 1520. Address decoders 1510A and 1510B may be configured to decode a read or write request to identify a memory location that corresponds to the read or write request (e.g., an address). Repair arrays 1508A and 1508B may include replacement pages for BISR, as discussed herein. ECC data paths 1514A and 1514B may be used to provide repair paths and/or TED values, as disclosed herein.

Caches 1516A and 1516B may be used to temporarily store read and/or write data for faster communication. As shown in FIG. 15, cache 1516B may correspond to data page 1400 of FIG. 14. It will be understood that although FIG. 15 shows the data page 1400 corresponding to cache 1516B, data page 1400 may correspond to 1516A, to main arrays 1506A and/or 1506B, repair arrays 1508A and/or 1508B, or the like or a combination thereof. Memory array 1506A and 1506B access may be organized into pages where at least one page (e.g., 256 bits) worth of bits may be stored in cache 1516A or 1516B. Cache 1516A and/or 1516B may include a plurality of ECC words and each ECC word may include one or more of data bits, parity bits, and/or inversion bits.

Sensing circuitry 1512A and 1512B may be used to sense high and/or low states for MTJs and may be used during an inversion bit-based test and/or for read operations. Sensing circuitry 1512A and 1512B may include components for midpoint sensing, self-referenced circuits, and/or trim registers to hold a plurality of reference levels associated with voltages or currents.

The system shown in block diagram 1500 may be used to provide bit efficiency improvement by using midpoint sensing or self-referenced sensing with low overhead ECC (e.g., single or double bit correct), as disclosed herein.

Figure 16:
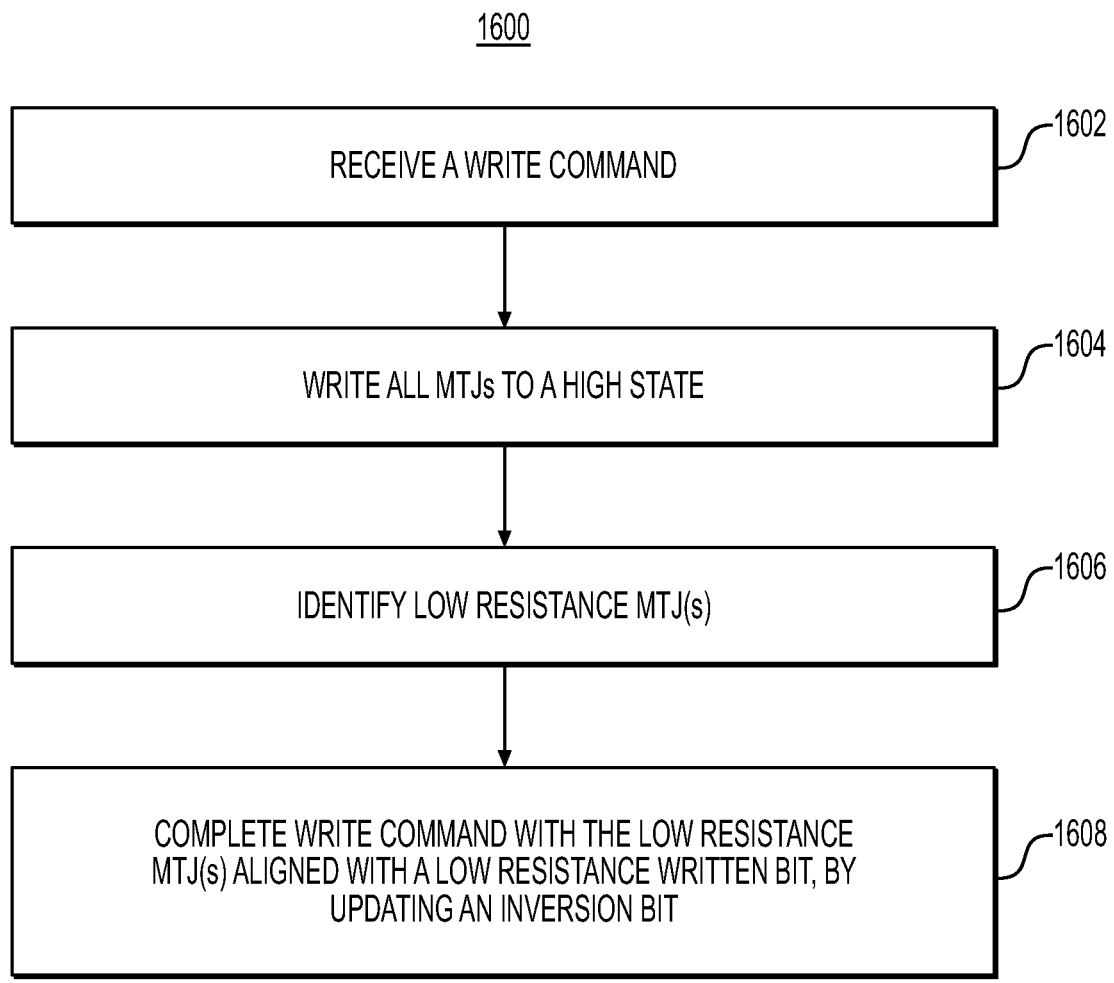
FIG. 16 depicts a flowchart for an exemplary method for using an inversion bit for a memory device, according to an aspect of the present disclosure.

FIG. 16 depicts a flowchart 1600 for an exemplary method for using an inversion bit for a memory device. The flowchart 1600 is based on midpoint sensing though it will be understood that the self-sensing operations disclosed herein may be used for an inversion bit implementation. At 1602 of flowchart 1600, a write command may be received. The write command may include an address for a page or word to be written.

Based on receipt of the write command at 1602, all MTJs for a given word may be written to a high state at 1604. As disclosed herein, the MTJs may be written to the high state by biasing the MTJs into a high resistive state. At 1606, low resistance MTJ(s) may be identified after the MTJs for a given word are written to a high state at 1604. If the number of low resistance MTJs is below a threshold then, at 1608, the write command from 1602 may be completed such that the low resistance MTJ(s) are aligned with a low resistance written MTJ, by updating the inversion bit. As disclosed herein, the low resistance MTJ may be aligned with a low resistance written MTJ such that if the write command requires the low resistance MTJ to be in a low state, then the write command is written as-is and the inversion bit indicates true values. If the write command requires the low resistance MTJ to be in a high state, then the write command is written inverted, and the inversion bit indicates inverted values.

In one embodiment, a method for managing a memory device may include determining whether a first address for a page in a first memory region is mapped in a map table; in response to determining whether the first address for the page in the first memory is mapped in the map table, setting a target address as (i) a second address identified in the map table as being mapped to the first address or (ii) the first address; determining a number of bits that fail in each word of a plurality of first-layer error correction code (ECC) words for the target address; and in response to determining that a number of bits that fail in a first-layer ECC word for the target address meet a predetermined threshold, adding the target address to the map table, writing-back contents from the target address to a repair address in the first memory region, and updating the map table by mapping the target address to the repair address.

Various embodiments of the method may include: wherein writing-back contents from the target address to the repair address and updating the map table are performed in parallel; updating the map table is performed during a power-up of the memory device; wherein the map table is stored in non-volatile memory; wherein the step of determining the number of bits that fail in each word of the plurality of first-layer ECC words for the target address is performed in response to a read operation and/or a write operation; wherein the map table is stored in a second memory region that is separate from the first memory region; wherein the second memory region is a magnetic tunnel junction (MTJ) mini-array; wherein the MTJ mini-array includes a plurality of array circuits and a data path including ECC wordline drivers and ECC write drivers; further including: while powering up the memory device, reading the map table from the MTJ mini-array to a plurality of registers, and in response to an unrecoverable ECC fail occurring, powering up the memory in a fail-safe mode; wherein the step of determining whether the first address for the page in the first memory region is mapped in the map table includes: while powering up the memory device, reading the map table from the MTJ mini-array to a plurality of registers; and searching the plurality of registers to determine whether the first address corresponds to a repair address in the map table.

In one embodiment, a memory device may include a first memory region; and a map table, wherein the memory device is configured to: determine whether a first address for a page in the first memory region is mapped in the map table; in response to determining that the first address is mapped in the map table, set a target address as a second address identified in the map table as being mapped to the first address; in response to determining that the first address is not mapped in the map table, set the target address as the first address; determine a number of bits that fail in each word of a plurality of first-layer error correction code (ECC) words for the target address; and in response to determining that a number of bits that fail in a first-layer ECC word for the target address meet a predetermined threshold, add the target address to the map table, write-back contents from the target address to a repair address in the first memory region, and update the map table by mapping the target address to the repair address.

Various embodiments of the memory device may include: wherein the memory device is further configured to perform the write-back of the contents from the target address to the repair address and the update of the map table in parallel; wherein the memory device is further configured to update the map table during a power-up of the memory device; wherein the map table is stored in non-volatile memory; wherein the memory device is further configured to determine the number of bits that fail in each word of the plurality of first-layer ECC words for the target address in response to a read operation and/or a write operation; wherein the map table is stored in a second memory region that is separate from the first memory region; wherein the second memory region is a magnetic tunnel junction (MTJ) mini-array; wherein the MTJ mini-array includes a plurality of array circuits and a data path including ECC wordline drivers and ECC write drivers; wherein the memory device is further configured to, while powering up the memory device, read the map table from the MTJ mini-array to a plurality of registers, and in response to an unrecoverable ECC fail occurring the map table, power up the memory in a fail-safe mode; wherein the memory device is further configured to: determine whether the first address for the page in the first memory region is mapped in the map table includes: while powering up the memory device, read the map table from the MTJ mini-array to a plurality of registers; and search the plurality of registers to determine whether the first address corresponds to a repair address in the map table.

In one embodiment, a method for managing a memory device may include receiving a write command to write at a page in a memory bank, the page having a page address; receiving a write command to write a page in a memory bank, the page having a page address; identifying an actual page address, wherein the actual page address is a regular page address or the actual page address is a mapped page address; detecting an error correction code (ECC) fail at the actual page address; identifying that the actual page address is included in a threshold error detection (TED) table; determining that the actual page address is included in the TED table a threshold error value number of times; generating a new repair row and writing the write command in the new repair row, based on determining that the actual page address is included in the TED table a threshold error value number of times; and updating a BISR map table to include the new repair row.

Various embodiments of the memory device may include: wherein the threshold error value is determined based on a temperature from at least one of a chip temperature, a circuit temperature, or an ambient temperature meeting a threshold temperature value; updating the TED table to indicate an additional error instance for the actual page address, based on detecting the ECC fail at the actual page address; determining that at least one of a chip temperature, a circuit temperature, or an ambient temperature is above a threshold temperature value; and disabling generation of the new repair row based on determining that at least one of the chip temperature, the circuit temperature, or the ambient temperature is above the threshold temperature value; wherein the BISR map table and the TED table are a single table.

In one embodiment, a method for managing a memory device may include receiving a write command for a word to be written at an address; writing a plurality of magnetic tunnel junctions (MTJs) associated with the address to a high resistive state; sensing the state of each of the plurality of MTJs based on a reference voltage; identifying a single low resistance MTJ based on sensing the state of the plurality of MTJs; and completing the write command by configuring an inversion bit such that if the write command requires the single low resistance MTJ to be in a high written resistive state, then the word is written in an inverted format and the inversion bit is configured to indicate an inversion and such that if the write command requires the single low resistance MTJ to be in a low written resistive state, then the word is written in a true format and the inversion bit is configured to indicate the true format.

Various embodiments of the memory device may include: identifying an additional low resistance MTJ based on sensing the state of the plurality of MTJs; triggering a built-in self-repair (BISR) procedure based on identifying the single low resistance MTJ and the additional low resistance MTJ; and generating a repair page for the ECC word; wherein the reference voltage is a mid-point voltage such that a detected voltage above the mid-point voltage corresponds to a high state and a detected voltage at or below the mid-point voltage corresponds to a low state; wherein the high written resistive state corresponds to a binary true and the low written resistive state corresponds to a binary false; receiving a read command for the address; performing the read command using mid-point sensing; detecting an error; and performing error correction code (ECC) correction based on detecting the error.

In one embodiment, a medical device is disclosed for receiving a read command for the address, performing the read command using mid-point sensing, detecting an error and performing error correction code (ECC) correction based on detecting the error.

Various embodiments of the memory device may include a triple error detect table. The BISR control logic circuitry is in connection with the temperature sensor and is configured to activate or deactivate a BISR function based on the temperature reading.

The foregoing description of the inventions has been described for purposes of clarity and understanding. It is not intended to limit the inventions to the precise form disclosed. Various modifications may be possible within the scope and equivalence of the application.

We claim:

1. A method for managing a memory device, comprising:
   determining whether a first address for a page in a first memory region is mapped in a map table;
   in response to determining whether the first address for the page in the first memory region is mapped in the map table, setting a target address as (i) a second address identified in the map table as being mapped to the first address or (ii) the first address;
   determining a number of bits that fail in each word of a plurality of first-layer error correction code (ECC) words for the target address; and
   in response to determining that a number of bits that fail in a first-layer ECC word for the target address meet a predetermined threshold, adding the target address to the map table, writing-back contents from the target address to a repair address in the first memory region, and updating the map table by mapping the target address to the repair address.

2. The method of claim 1, wherein writing-back contents from the target address to the repair address and updating the map table are performed in parallel.

3. The method of claim 1, wherein updating the map table is performed during a power-up of the memory device.

4. The method of claim 1, wherein the map table is stored in non-volatile memory.

5. The method of claim 1, wherein the step of determining the number of bits that fail in each word of the plurality of first-layer ECC words for the target address is performed in response to a read operation and/or a write operation.

6. The method of claim 1, wherein the map table is stored in a second memory region that is separate from the first memory region.

7. The method of claim 6, wherein the second memory region is a magnetic tunnel junction (MTJ) mini-array.

8. The method of claim 7, wherein the MTJ mini-array comprises a plurality of array circuits and a data path comprising ECC wordline drivers and ECC write drivers.

9. The method of claim 7, further comprising:
   while powering up the memory device, reading the map table from the MTJ mini-array to a plurality of registers, and, in response to an unrecoverable ECC fail occurring, powering up the memory in a fail-safe mode.

10. The method of claim 7, wherein the step of determining whether the first address for the page in the first memory region is mapped in the map table comprises:
    while powering up the memory device, reading the map table from the MTJ mini-array to a plurality of registers; and
    searching the plurality of registers to determine whether the first address corresponds to a repair address in the map table.

11. The method of claim 1, further comprising:
    in response to determining that a number of bits that fail in the first-layer ECC word for the target address meet a second predetermined threshold, generating a new repair row and writing the contents from the target address to the new repair row; and
    updating a built-in self-repair (BISR) map table to include the new repair row.

12. The method of claim 11 further comprising:
    determining that at least one of a chip temperature, a circuit temperature, or an ambient temperature is above a threshold temperature value; and
    disabling generation of the new repair row based on determining that at least one of the chip temperature, the circuit temperature, or the ambient temperature is above the threshold temperature value.

13. The method of claim 1, wherein writing-back contents from the target address to the repair address is performed at a first time and updating the map table is performed at a second time after the first time.

14. The method of claim 1, wherein the predetermined threshold is determined based on at least one of a temperature from at least one of a chip temperature, a circuit temperature, or an ambient temperature meeting a threshold temperature value.

15. The method of claim 1, wherein a built-in self-repair (BISR) control logic circuitry is in connection with a temperature sensor and is configured to activate or deactivate a BISR function based on a temperature output by the temperature sensor.

16. The method of claim 1, further comprising:
    receiving a read command for the first address;
    performing the read command using mid-point sensing; and
    determining whether the first address for the page in the first memory region is mapped in the map table based on performing the read command.

17. The method of claim 1, wherein the map table is a built-in self-repair (BISR) map table.

18. The method of claim 17, further comprising:
    reading the BISR map table from a mini-array; and
    loading the BISR map table read form the mini-array into one or more registers.

19. The method of claim 1, wherein determining the number of bits that fail in each word of the plurality of first-layer ECC words comprises determining a magnetic tunnel junctions (MTJ) raw bit error rate (RBER).

20. The method of claim 1, further comprising:
- determining that the target address is not in a joint threshold error detection (TED) table; and
- recording the target address in the joint TED table based on determining that the target address is not in the joint TED table.

* * * * *